United States Patent
Lee et al.

(10) Patent No.: US 10,109,778 B2
(45) Date of Patent: Oct. 23, 2018

(54) DISPLAY DEVICE, METHOD OF MANUFACTURING THE SAME, AND METHOD OF HMD INTERFACING USING THE SAME

(71) Applicant: OPTOLANE Technologies Inc., Seongnam-shi, Gyonggi-do (KR)

(72) Inventors: DoYoung Lee, Seoul (KR); JaeWon Eom, Seoul (KR); JunHo Won, Namyangju (KR); Chang Hoon Han, Seongnam (KR)

(73) Assignee: OPTOLANE TECHNOLOGIES INC., Seongnam-Shi, Gyonggi-Do (KR)

( * ) Notice: Subject to any disclaimer, the term of this patent is extended or adjusted under 35 U.S.C. 154(b) by 338 days.

(21) Appl. No.: 15/058,569

(22) Filed: Mar. 2, 2016

(65) Prior Publication Data

US 2016/0275912 A1 Sep. 22, 2016

(30) Foreign Application Priority Data

Mar. 17, 2015 (KR) .......................... 10-2015-0036487
Jun. 25, 2015 (KR) .......................... 10-2015-0090517

(51) Int. Cl.
*H01L 33/58* (2010.01)
*G06F 3/01* (2006.01)
(Continued)

(52) U.S. Cl.
CPC .......... *H01L 33/58* (2013.01); *G02B 27/0172* (2013.01); *G06F 3/013* (2013.01);
(Continued)

(58) Field of Classification Search
CPC .. G09G 5/10; G09G 5/08; G06F 3/013; G06F 3/04817; G06F 3/04842; G02B 27/0172; H01L 31/18; H01L 33/62; H01L 33/58
See application file for complete search history.

(56) References Cited

U.S. PATENT DOCUMENTS 8,049,743 B2   11/2011   Kang
8,520,114 B2   8/2013   Cok et al.
(Continued)

FOREIGN PATENT DOCUMENTS

JP   2014-527321   10/2014
KR   10-2008-0071729   8/2008

*Primary Examiner* — Shaheda Abdin
(74) *Attorney, Agent, or Firm* — Kile Park Reed & Houtteman PLLC

(57) ABSTRACT

A display device includes an upper structure, a lower structure, and a connecting element. The upper structure includes a display element having a first electrode, a light emitting layer, and a second electrode. The light emitting layer is disposed on the first electrode to generate light. The second electrode is disposed on the light emitting layer to transmit the light. The lower structure includes a display driving circuit. The display driving circuit receives an image signal to apply an electric power to the first electrode. The lower structure is physically separated from the upper structure to be spaced apart from the upper structure by a predetermined distance with respect to a vertical direction. The connecting element is disposed between the upper structure and the lower structure to connect the first electrode to the display driving circuit.

12 Claims, 30 Drawing Sheets

(51) Int. Cl.
*G06F 3/0481*   (2013.01)
*G06F 3/0484*   (2013.01)
*G02B 27/01*    (2006.01)
*H01L 31/18*    (2006.01)
*G09G 3/3233*   (2016.01)

(52) U.S. Cl.
CPC ...... *G06F 3/04817* (2013.01); *G06F 3/04842* (2013.01); *G09G 3/3233* (2013.01); *H01L 31/18* (2013.01); *G02B 2027/0112* (2013.01); *G09G 2300/043* (2013.01); *G09G 2300/0426* (2013.01); *G09G 2300/0809* (2013.01); *G09G 2310/0262* (2013.01); *G09G 2320/043* (2013.01); *G09G 2360/144* (2013.01)

(56) References Cited

U.S. PATENT DOCUMENTS

| | | | | |
|---|---|---|---|---|
| 2002/0011978 | A1* | 1/2002 | Yamazaki | G09G 3/30 345/87 |
| 2003/0048072 | A1* | 3/2003 | Ishihara | H01L 51/5262 313/506 |
| 2005/0073243 | A1* | 4/2005 | Yamazaki | H01L 27/3246 313/498 |

* cited by examiner

DISPLAY DEVICE, METHOD OF MANUFACTURING THE SAME, AND METHOD OF HMD INTERFACING USING THE SAME

CROSS-REFERENCE TO RELATED APPLICATION(S)

This application claims priority under 35 USC § 119 to Korean Patent Applications No. 10-2015-0036487, filed on Mar. 17, 2015 and No. 10-2015-0090517, filed on Jun. 25, 2015 in the Korean Intellectual Property Office (KIPO), the contents of which are incorporated herein in its entirety by reference.

BACKGROUND

1. Technical Field

Example embodiments relate generally to a display device, a method of manufacturing the same, and a method of HMD interfacing using the same. More particularly, embodiments of the inventive concept relate to a display device including a photo sensor having small size and high resolution, a method of manufacturing the same, and a method of HMD interfacing using the same.

2. Description of the Related Art

Size and weight of electronic devices are decreased, and portability of the electronic devices are increased. In particular, information communication technology is developed, and portable electronic devices which are capable of processing information are also developed.

Recently, a photo sensor is implanted into a display device, and a photo sensor implanted display device and an interface having the same are developed.

SUMMARY

Some example embodiments provide a display device including a photo sensor having small size and high resolution.

Some example embodiments also provide a method of manufacturing the same.

Some example embodiments also provide a method of HMD interfacing using the same.

According to some example embodiments, a display device includes an upper structure, a lower structure, and a connecting element. The upper structure includes a display element having a first electrode, a light emitting layer, and a second electrode. The light emitting layer is disposed on the first electrode to generate light. The second electrode is disposed on the light emitting layer to transmit the light. The lower structure includes a display driving circuit. The display driving circuit receives an image signal to apply an electric power to the first electrode. The lower structure is physically separated from the upper structure to be spaced apart from the upper structure by a predetermined distance with respect to a vertical direction. The connecting element is disposed between the upper structure and the lower structure to connect the first electrode to the display driving circuit.

In example embodiments, the display driving circuit may include a driving transistor applying an electric signal to the display element, a capacitor storing a voltage applied to the driving transistor, and a select transistor selecting a driving display element.

In example embodiments, the display element of the upper structure may be spaced apart from an adjacent display element so that an external light may be incident into a space between the adjacent display elements. The lower structure may further include a photo sensing element and a photo sensing readout circuit. The photo sensing element may be disposed between the display elements to change the external light into an electric signal. The photo sensing readout circuit may generate a photo sensing signal using the electric signal received from the photo sensing element.

In example embodiments, the photo sensing readout circuit may include a transfer transistor, a reset transistor, a driving transistor, and a select transistor. The transfer transistor may transmit the electric signal generated by the photo sensing element. The reset transistor may initialize the photo sensing readout circuit. The driving transistor may drive a signal line by the electric signal readout by the photo sensing readout circuit. The select transistor may control connection between the driving transistor and the signal line.

In example embodiments, the display driving circuit, the photo sensing element, and the photo sensing readout circuit may be disposed on the same substrate.

In example embodiments, the light emitting layer may generate a bluish light or a ultraviolet light. The display element may further include a photo change layer and a color filter. The photo change layer may be disposed on the second electrode to change the light generated from the light emitting layer into a visible light. The color filter may be disposed on the photo change layer to change the visible light into a primary color light.

In example embodiments, the light emitting layer may generate a bluish light or a ultraviolet light. The display element may further include a photo change layer disposed on the second electrode to change the light generated from the light emitting layer into a primary color light.

According to some example embodiments, a display device may include an upper structure, a lower structure, and a connecting element. The upper structure includes a display element having a light emitting layer and a first electrode. The light emitting layer generates light. The first electrode is disposed under the light emitting layer to be coupled with a positive electrode and a negative electrode of the light emitting layer. The first electrode does not block a path of the light generated from the light emitting layer. The lower structure includes a display driving circuit, the display driving circuit receiving an image signal to apply an electric power to the positive electrode and the negative electrode of the light emitting layer through the first electrode. The lower structure is physically separated from the upper structure to be spaced apart from the upper structure by a predetermined distance with respect to a vertical direction. The connecting element is disposed between the upper structure and the lower structure to connect the first electrode to the display driving circuit.

In example embodiments, the display element of the upper structure may be spaced apart from an adjacent display element so that an external light may be incident into a space between the adjacent display elements. The lower structure may further include a photo sensing element and a photo sensing readout circuit. The photo sensing element may be disposed between the display elements to change the external light into an electric signal. The photo sensing readout circuit may generate a photo sensing signal using the electric signal received from the photo sensing element.

In example embodiments, the photo sensing readout circuit may include a transfer transistor, a reset transistor, a driving transistor, and a select transistor. The transfer transistor may transmit the electric signal generated by the photo sensing element. The reset transistor may initialize the photo sensing readout circuit. The driving transistor may drive a signal line by the electric signal readout by the photo sensing readout circuit. The select transistor may control connection between the driving transistor and the signal line.

According to some example embodiments, a method of manufacturing a display device is provided as follows. A display driving circuit, a photo sensing element, and a photo sensing readout circuit are formed on the same surface of a base substrate. The photo sensing element changes an external light into an electric signal. The photo sensing readout circuit changes the electric signal into a photo sensing signal. A connecting element is formed on the display driving circuit. A light emitting layer and a first electrode are sequentially formed on an additional substrate. The first electrode is connected to the light emitting layer. The additional substrate on which the light emitting layer and the first electrode are formed is aligned over the base substrate on which the display driving circuit, the photo sensing element, and the photo sensing readout circuit are formed. The first electrode is combined with the connecting element. The additional substrate is removed from the light emitting layer. A second electrode is formed on the light emitting layer. The second electrode transmits a light generated from the light emitting layer.

In example embodiments, a photo change layer may further be formed on the second electrode. The photo change layer may transform the light generated from the light emitting layer. A color filter filtering a light generated from the photo change layer may further be formed into a primary color light.

According to some example embodiments, a method of manufacturing a display device is provided as follows. A display driving circuit, a photo sensing element, and a photo sensing readout circuit are formed on the same surface of a base substrate. The photo sensing element changes an external light into an electric signal. The photo sensing readout circuit changes the electric signal into a photo sensing signal. A connecting element is formed on the display driving circuit. A light emitting layer is sequentially formed on an additional substrate and first and second electrodes on a first substrate of the light emitting layer. The first and second electrodes are connected to the light emitting layer. The additional substrate on which the light emitting layer and the first and second electrodes are formed is aligned over the base substrate on which the display driving circuit, the photo sensing element, and the photo sensing readout circuit are formed. The first electrode is combined with the connecting element. The additional substrate is removed from the light emitting layer.

According to some example embodiments, a method of head mount display (HMD) interfacing using a display device is provided. The display device includes an upper structure, a lower structure, and a connecting element. The upper structure includes a display element having a first electrode, a light emitting layer disposed on the first electrode to generate light, and a second electrode disposed on the light emitting layer to transmit the light. The display element of the upper structure is spaced apart from an adjacent display element so that an external light is incident into a space between the adjacent display elements. The lower structure includes a display driving circuit, a photo sensing element, and a photo sensing readout circuit generating a photo sensing signal using the electric signal received from the photo sensing element. The display driving circuit receives an image signal to apply an electric power to the second electrode. The display driving circuit is overlapped with the first electrode of the upper structure to be disposed under the upper structure. The photo sensing element is disposed between the display elements to change the external light into an electric signal. The lower structure is physically separated from the upper structure by a predetermined distance with respect to a vertical direction. The connecting element is disposed between the upper structure and the lower structure to connect the first electrode to the display driving circuit. The method is provided as follows. A lock mode is released using the photo sensing element and the photo sensing readout circuit. An operation of continuously blinking two or more times or closing one eye is sensed to display a cursor or a command icon on the display element. Iris movement is sensed so that the iris movement is coupled with the cursor. The cursor is transported to the command icon. The command icon is selected through blinking one or more times. A command is performed corresponding to the command icon.

According to the present invention, the display element and the display driver circuit are separated and stacked, so that the display driver circuit may be variously designed regardless of the display element. Thus, an opening ratio of the display element is improved, and various circuits for improving image display quality may be added into the display driver circuit.

Also, the display driver circuit includes the second transistor for stably charging the first capacitor, the third transistor for compensating the output voltage of the driving transistor, and the fourth transistor to output a stable driving voltage.

In addition, the display driver circuit uses signals output from the current scan line and an adjacent scan line to securely charge the first capacitor and compensate the driving voltage output from the driving transistor, thereby outputting a stable driving voltage.

Also, the photo sensing element is disposed in a different layer physically separated from the display element to minimize an effect of a noise caused by a display output light generated by the display element.

Also, the upper structure includes the light guide, the light shield layer, the optical filter to block the light leaked from the display element, thereby improving sensing accuracy of the photo sensing element.

Also, the time for driving the display element and the photo sensing element are alternately arranged to remove a noise caused by the display element, thereby improving the sensing accuracy of the photo sensing element.

Also, the display elements are arranged in the hexagonal array shape to maximize the opening ratio, thereby improving an image display quality.

Also, the photo sensing elements are arranged in the hexagonal array shape to easily compensate an error caused a defected element using data of the adjacent element.

Also, the photo sensing element only senses the light having passed through the color filter to decrease noise caused by the display element and improve the sensing accuracy.

Also, the photo sensing readout circuit includes the reset transistor and the select transistor to decrease the noise caused by the display element, thereby improving the sensing accuracy.

Also, the photo sensing readout circuit senses an external luminance to control input of the electric signal to the driving transistor, thereby preventing deterioration of the driving transistor by a long time use.

Also, the second electrode disposed on the light emitting layer includes the lines of the star shape, etc., to improve the transmittance of the light generated from the light emitting layer.

Thus, a small size and a high resolution suitable for a micro display may be realized using the three-dimensional stacking process.

Also, a manufacturing cost of the upper structure is decreased, and various materials may be used for the display element, so that lifetime problem of a conventional display such as a conventional organic light emitting display (OLED) device, etc., may be solved. Furthermore, when light emitting diodes (LEDs) are used, more stable operation may be possible and a size of a unit cell may be decreased. Thus, high resolution may be realized on a micro display.

Also, the driving circuit part is physically separated from the display element, so that the driving circuit part may be manufactured using a conventional semiconductor process. Thus, stability of the driving circuit part is excellent, and deterioration of electric characteristics generated in conventional amorphous silicon (a-Si) or polysilicon may be solved.

Also, the lower structure and the upper structure are separately manufactured using three dimensional stacking process, so that the driving circuit part of the lower structure does not affect the area of the display element part of the upper structure, thereby maximizing the opening ratio. Furthermore, a conventional semiconductor process may be used for the driving circuit part to improve stability, so that the number and the arrangement of the transistors may be arbitrarily changed by the vertical arrangement disposed under the display elements. Thus, various compensating circuits may be added to the driving circuit.

Also, the driving circuit part and the sensing element of the lower plate may be formed through the conventional semiconductor process, and the display element of the upper plate may be formed through various processes such as using composite semiconductors, etc., so that the processes for the upper plate may be separated from the processes for the lower plate. Thus, a dual type element for simultaneously displaying and sensing with small cost may be realized using currently developed processes.

Also, driving timings of the display element and the photo sensing element are separated from a time axis to decrease an interference noise generated in the photo sensing element by the display element.

Also, one photo sensing element is disposed on a contact portion between three display elements to increase a space resolution of the display array and the photo sensing array based on arrangement characteristics of pixel cells. Also, when an error of the photo sensing element is generated, data compensation becomes easier using data of the peripheral element.

Thus, a color display device having photo sensing operation may be manufactured.

Also, the display device is controlled by iris recognition to be controlled without an additional interface outside of the display device. Thus, the size of the interface unit is decreased, and the size of the display device is decreased. Also, the display device may be controlled without a hand.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
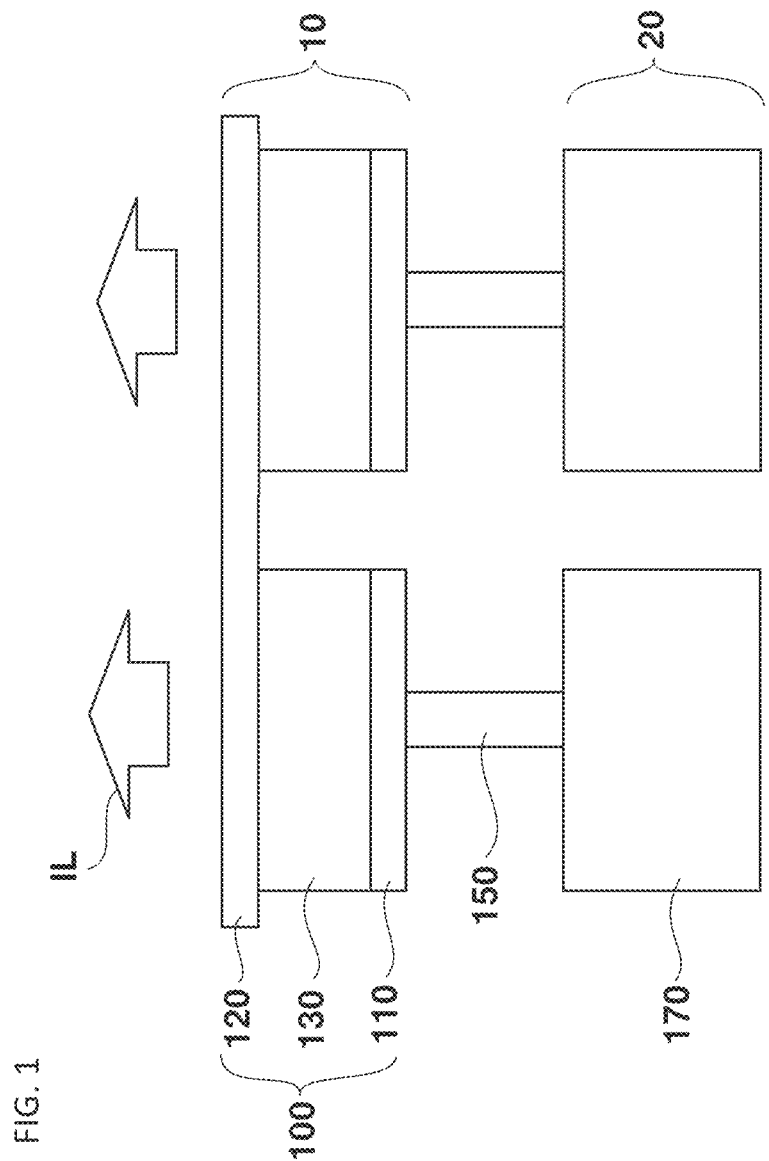
FIG. 1 is a cross-sectional view illustrating a display device according to one example embodiment of the present invention.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a display device according to one example embodiment of the present invention.

Referring to FIG. 1, the display device includes an upper structure 10 and a lower structure 20, and generates a display output light IL. The display output light IL is output from a surface of the upper structure 10.

In the present example embodiment, the display device may further include a connecting element 150. The connecting element 150 connects the upper structure 10 to the lower structure 20. For example, the connecting element 150 electrically connects the upper structure 10 to the lower structure 20.

In the present example embodiment, the upper structure 10 includes a display element 100. For example, the upper structure 10 may include a plurality of display elements 100. The display element 100 includes a first electrode 110, a second electrode 120, and a light emitting layer 130.

The first electrode 110 is disposed under the display element 100. A current, a voltage, etc., are applied to the light emitting layer 130 by the first electrode 110 based on a signal output from a display driver circuit 170. In the present example embodiment, the first electrode 110 includes metal, metal compound, etc., to prevent light generated from the light emitting layer 130 from emitting in a lower direction. For example, the first electrode 110 includes a metal having high reflectivity to reflect the light generated from the light emitting layer 130 toward a front direction. When the first electrode 110 includes the metal having the high reflectivity, luminance of the display element 100 is improved, and sensitivity of the photo sensing element 210 disposed in the lower structure 20 is improved. In the present example embodiment, the first electrode 110 is disposed in each pixel. Alternatively, two first electrodes 110 may be disposed in each pixel, and may be used in various displays such as 3D image, etc.

The second electrode 120 is disposed on the display element 100, and face the first electrode 110. In the present example embodiment, the second electrode 120 includes a transparent conductive material to transmit the display output light IL generated from the light emitting layer 130. For example, the second electrode 120 may include a metal oxide such as indium tin oxide, indium oxide, tin oxide, etc., a metal mesh, and/or the like. In the present example embodiment, the second electrode 120 may cover a plurality of pixels.

Figure 32:
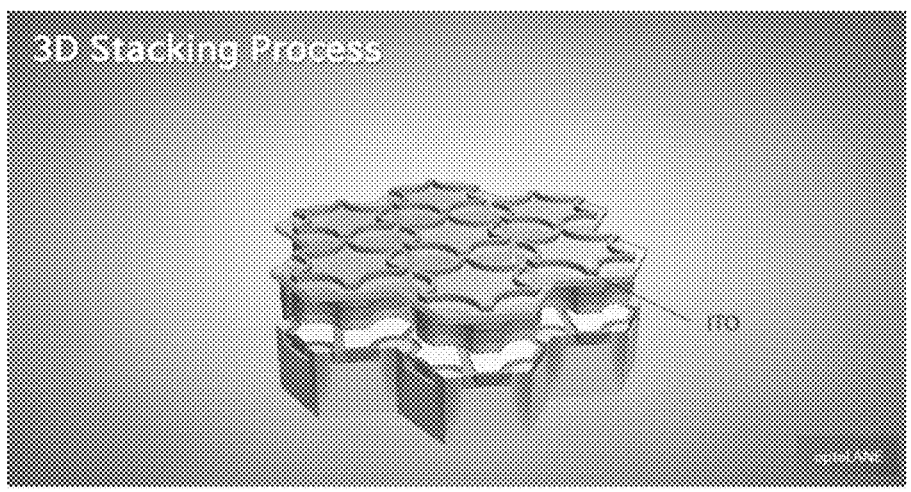

The second electrode 120 may cover an entire of the light emitting layer 130, or may cover only a portion of the light emitting layer 130 in a line shape. For example, the second electrode 120 may include lines of a hexagonal star shape (ITO) as shown in FIG. 32.

The light emitting layer 130 is interposed between the first electrode 110 and the second electrode 120 to generate the light using the current, the voltage difference, an electric field, etc., applied between the first electrode 110 and the second electrode 120. In the present example embodiment, the light emitting layer 130 may include various light emitting material such as organic light emitting material, quantum dot, etc.

The light generated from the light emitting layer 130 passes through the second electrode 120 to be emitted as the display output light IL.

The lower structure 20 includes the display driver circuit 170. The display driver circuit 170 applies the current, the voltage difference, etc., to the display element 100 based on the image signal. In the present example embodiment, the lower structure 20 includes a plurality of display driver circuits 170 arranged in an array shape.

The connecting element 150 electrically connects the upper structure 10 and the lower structure 20 to transmit the signal output from the display driver circuit 170 to the display element 100. In the present example embodiment, the connecting element 150 may include various connecting members such as a metal pad, a bump, an anisotropic conductive film (ACF), a flexible printed circuit board (FPCB), etc.

According to the present example embodiment, the display element 100 and the display driver circuit 170 are separated and stacked, so that the display driver circuit 170 may be variously designed regardless of the display element 100. Thus, the opening ratio of the display element 100 is improved, and various circuits for improving the image display quality may be added to the display driver circuit 170.

The display element 100 may be used for various display elements such as an organic light emitting display element, a liquid crystal display element, an electrophoretic display element, a light emitting diode, etc.

Figure 2:
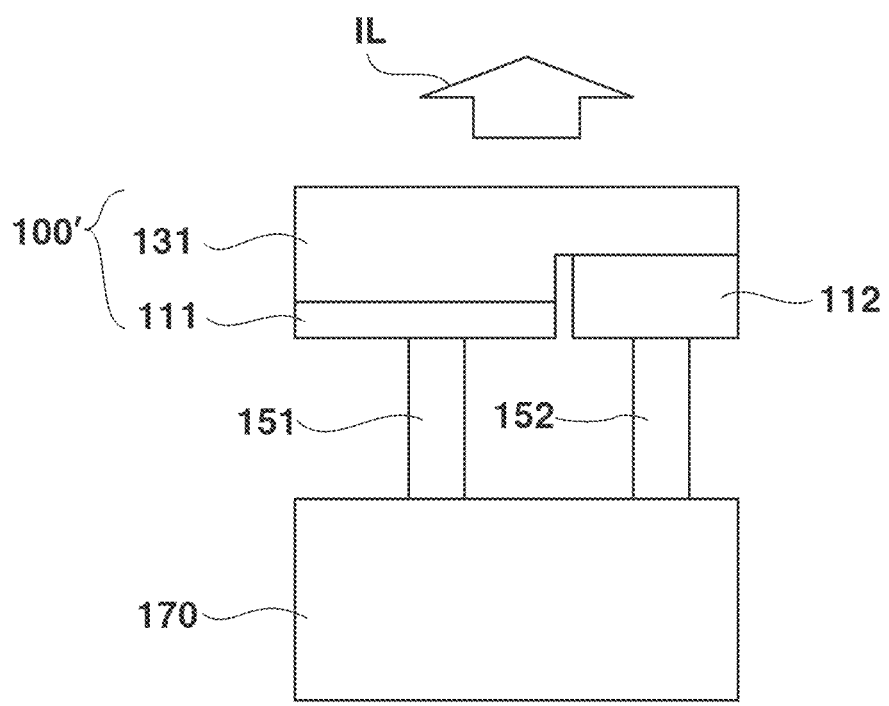
FIG. 2 is a cross-sectional view illustrating a display device according to another example embodiment of the present invention.

FIG. 2 is a cross-sectional view illustrating a display device according to another example embodiment of the present invention. The display device of FIG. 2 is substantially the same as shown in FIG. 1 except a first electrode and a second electrode. Thus, any repetitive explanations concerning the same elements will be omitted.

Referring to FIG. 2, the display device includes an upper structure 10 (shown in FIG. 1) and a lower structure 20 (shown in FIG. 1).

The upper structure 10 (shown in FIG. 1) includes a display element 100'.

The display element 100' includes a first electrode 111, a second electrode 112, and a light emitting layer 131.

An upper surface of the light emitting layer 131 has a flat shape, and a lower surface of the light emitting layer 131 has a stepped portion.

The first electrode 111 is formed on an outer surface of the stepped portion formed on the lower surface of the light emitting layer 131. The second electrode 112 is formed on an inner surface of the stepped portion.

In the present example embodiment, a thickness of the second electrode 112 is greater than a thickness of the first electrode 111. A difference between the thicknesses of the first and second electrodes 111 and 112 is substantially the same as the stepped portion. For example, a metal layer (not shown) filling the stepped portion may be formed on the light emitting layer 131 having the stepped portion, and then, a portion of the metal layer (not shown) is removed, and thus, the first and second electrodes 111 and 112 are formed.

A light is generated from the light emitting layer 131 by the stepped portion formed in the light emitting layer 131 and an electric power applied between the first and second electrodes 111 and 112.

In the present example embodiment, the first and second electrodes 111 and 112 include metal to prevent leakage of the light generated from the light emitting layer 131 toward a lower portion of the display device.

According to the present example embodiment, the first and second electrodes 111 and 112 are formed along the stepped portion formed on the lower surface of the light emitting layer 131, and an electrode is not formed on the upper surface of the light emitting layer 131. Thus, luminance is improved, and an energy consumption is decreased.

Figure 3:
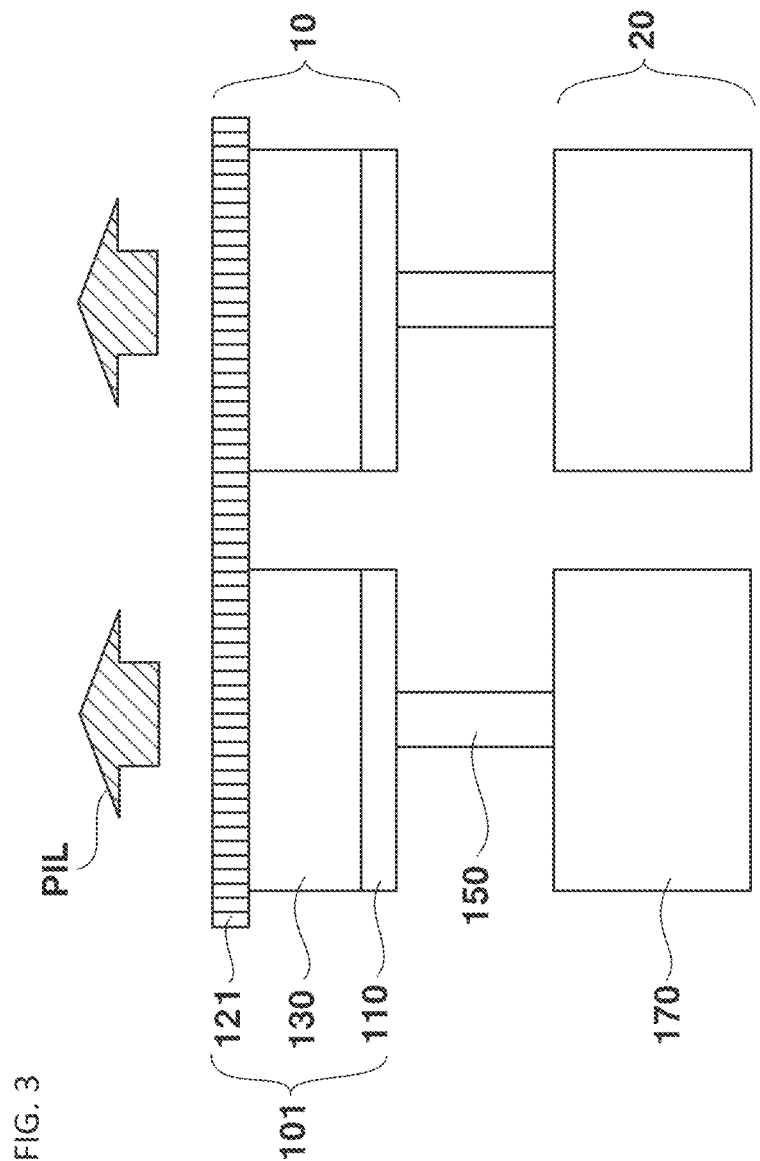
FIG. 3 is a cross-sectional view illustrating a display device according to another example embodiment of the present invention.

FIG. 3 is a cross-sectional view illustrating a display device according to another example embodiment of the present invention. The display device of FIG. 3 is substantially the same as shown in FIG. 1 except a second electrode and a polarizing display output light. Thus, any repetitive explanations concerning the same elements will be omitted.

Referring to FIG. 3, the display device includes an upper structure 10 and a lower structure 20.

The upper structure 10 includes a display element 101.

The display element 101 includes a first electrode 110, a second electrode 121, and a light emitting layer 130.

The second electrode 121 includes a plurality of thin metal lines arranged substantially in parallel. When the second electrode 121 includes the metal lines, optical phenomenon such as diffraction, interference, etc., between adjacent metal lines are generated to polarize light passing therethrough.

In the present example embodiment, the light generated from the light emitting layer 130 passes through the second electrode 121 to be polarized, thereby generating a polarizing display output light PIL.

Figure 4:
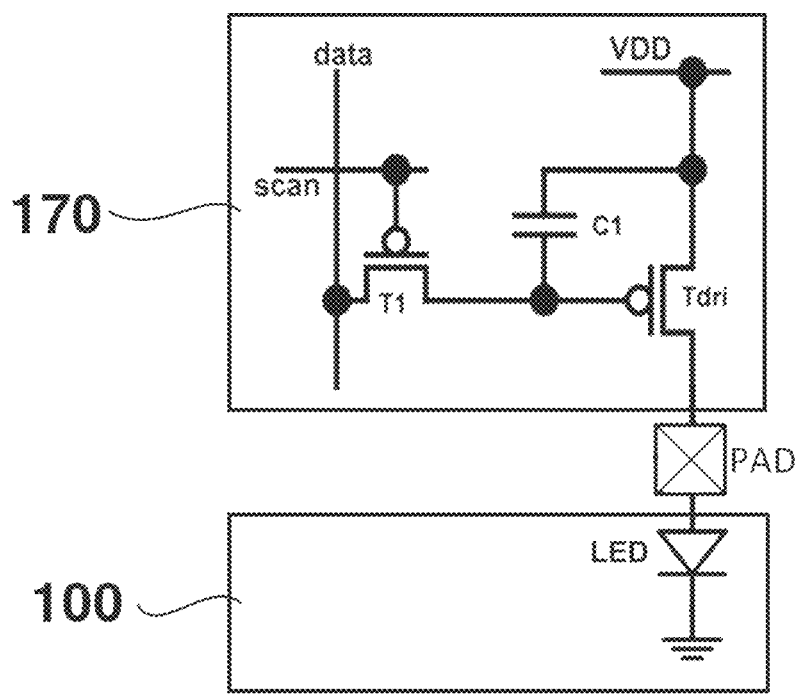
FIG. 4 is a circuit diagram illustrating a display device according to one example embodiment of the present invention.

FIG. 4 is a circuit diagram illustrating a display device according to one example embodiment of the present invention.

Referring to FIGS. 1 and 4, the display driver circuit 170 includes a data line data, a scan line scan, a driving voltage line VDD, a first transistor T1, a driving transistor Tdri, and a first capacitor C1.

The scan line scans sequentially applies scan signals to input electrodes of the first transistors T1 of the display driver circuit 170 arranged in an array shape. The data lines data are arranged in a direction crossing the scan lines scan to apply a data signal to a control electrode of the first transistor T1.

The first transistor T1 receives and outputs the data signal of the data line data based on the control of the scan signal of the scan line scan.

The first capacitor C1 is interposed between an output electrode of the first transistor T1 and the driving voltage line VDD to maintain the data signal output from the first transistor T1 during one frame.

The control electrode and the input electrode of the driving transistor Tdri are connected to electrodes of the first capacitor C1, respectively. The driving transistor Tdri transmits an electric power charged in the first capacitor C1 to the display element 100 through a pad PAD.

Figure 5:
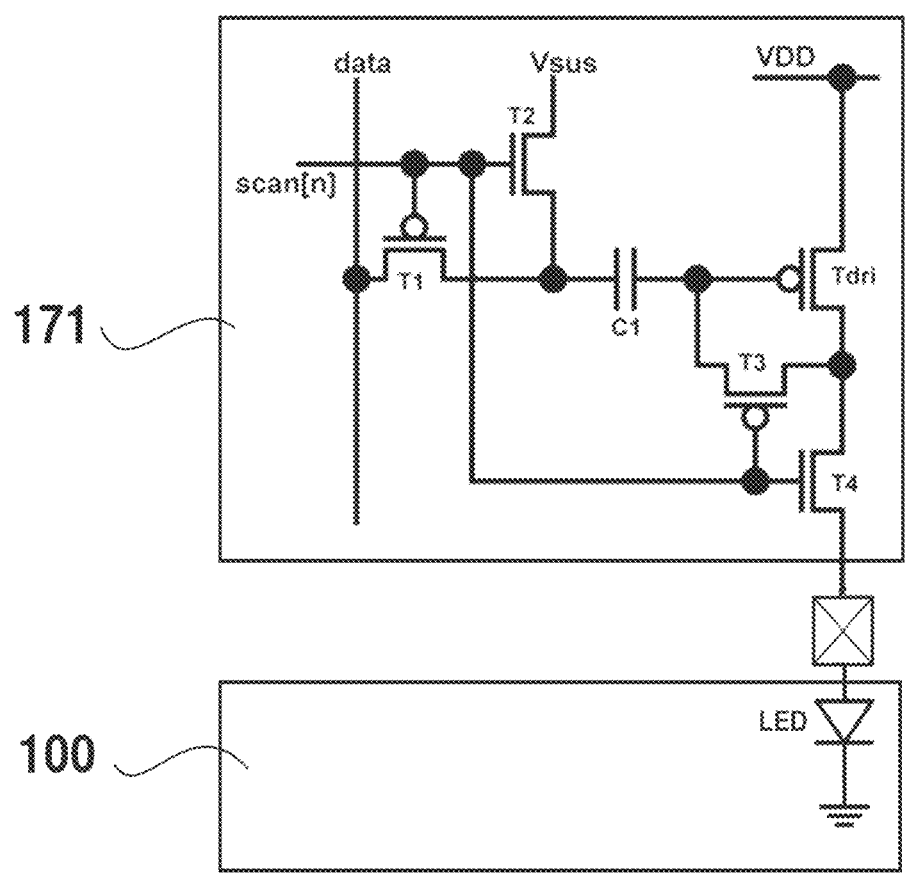
FIG. 5 is a circuit diagram illustrating a display device according to another example embodiment of the present invention.

FIG. 5 is a circuit diagram illustrating a display device according to another example embodiment of the present invention. The display device of FIG. 5 is substantially the same as shown in FIG. 4 except a structure for compensating a driving transistor. Thus, any repetitive explanations concerning the same elements will be omitted.

Referring to FIGS. 1, 4, and 5, the display driver circuit 171 includes a data line data, a scan line scan[n], a storage voltage line Vsus, a driving voltage line VDD, a first transistor T1, a second transistor T2, a third transistor T3, a fourth transistor T4, a driving transistor Tdri, and a first capacitor C1.

The second transistor T2 outputs a storage voltage applied from the storage voltage line Vsus based on the control of a scan signal applied through the scan line scan.

The storage voltage output from the second transistor T2 compensates a data voltage output from the first transistor T1 to securely charge the first capacitor C1.

The driving voltage compensated by the third transistor T3 and the fourth transistor T4 is applied to the display element 100 through a pad.

According to the example embodiment of the present invention, the display driver circuit 171 includes the second transistor T2 stably charging the first capacitor C1, the third transistor T3 compensating the output voltage of the driving transistor Tdri, and the fourth transistor T4, thereby securely outputting the driving voltage.

Figure 6:
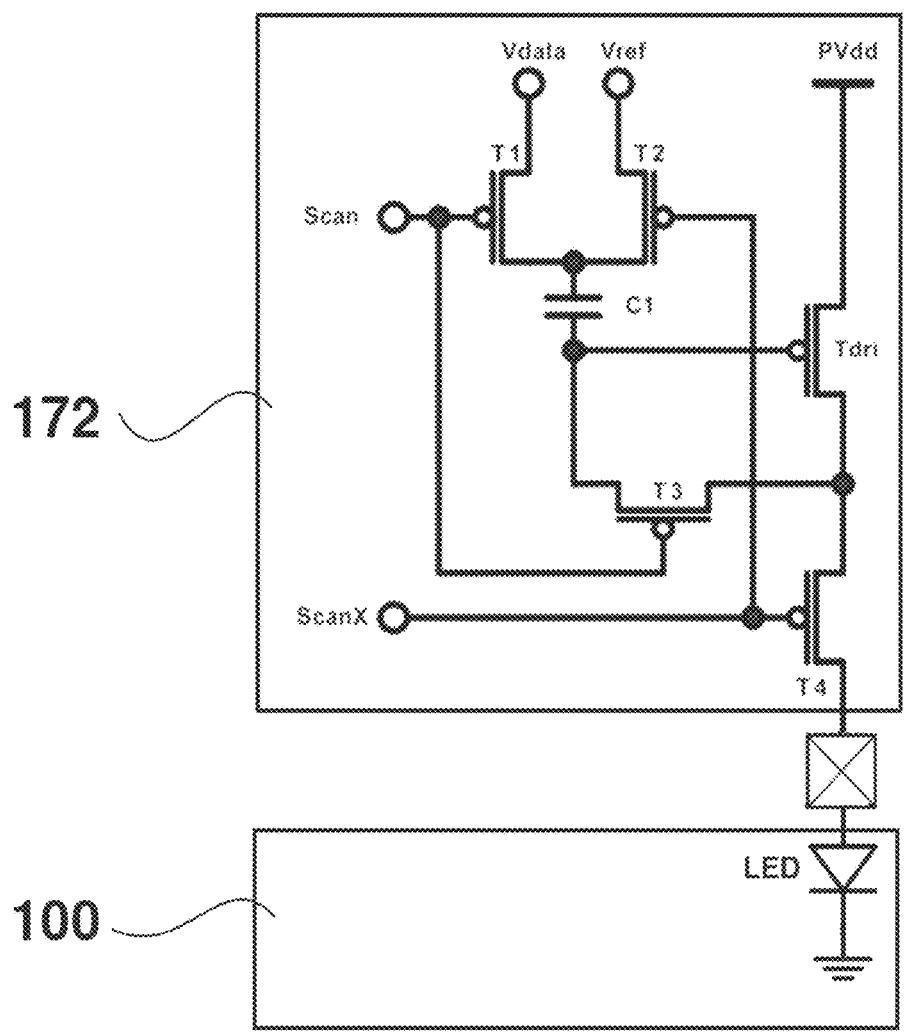
FIG. 6 is a circuit diagram illustrating a display device according to another example embodiment of the present invention.

FIG. 6 is a circuit diagram illustrating a display device according to another example embodiment of the present invention. The display device of FIG. 6 is substantially the same as shown in FIG. 4 except a structure for compensating a driving transistor. Thus, any repetitive explanations concerning the same elements will be omitted.

Referring to FIGS. 1, 4, and 6, the display driver circuit 172 includes a data line data, a current scan line scan, and an adjacent scan line scanX, a reference voltage line Vref, a driving voltage line PVdd, a first transistor T1, a second transistor T2, a third transistor T3, a fourth transistor T4, a driving transistor Tdri, and a first capacitor C1.

The second transistor T2 outputs a reference voltage applied from the reverence voltage line Vref based on the control of an adjacent scan signal applied through the adjacent scan line scanX.

The reference voltage output from the second transistor T2 compensates a data voltage output from the first transistor T1 to securely charge the first capacitor C1.

The third transistor T3 and the fourth transistor T4 compensate the driving voltage output from the driving transistor Tdri by a current scan signal and the adjacent scan signal, respectively.

The driving voltage compensated by the third transistor T3 and the fourth transistor T4 is applied to the display element 100 through a pad.

According to the example embodiment of the present invention, the display driver circuit 172 securely charges the first capacitor and compensates the driving voltage output from the driving transistor Tdri using the signals output from the current scan line scan and the adjacent scan line scanX, thereby securely outputting the driving voltage.

In the example embodiment, only the second to fourth transistors T2, T3, and T4 are disclosed as the compensating circuit, but various and complex compensating circuits are also possible since the display driver circuit 172 is separated from and stacked with the display element 100.

Figure 7:
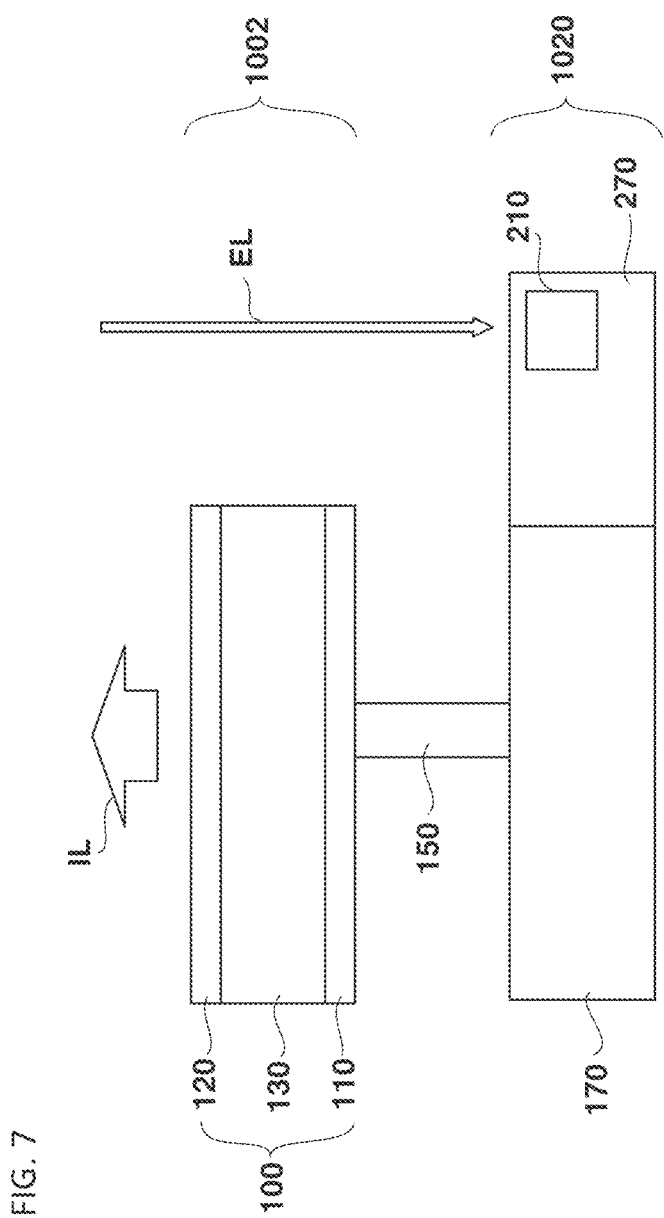
FIG. 7 is a cross-sectional view illustrating a display device according to another example embodiment of the present invention.

FIG. 7 is a cross-sectional view illustrating a display device according to another example embodiment of the present invention. The display device of FIG. 7 is substantially the same as shown in FIG. 1 except a photo sensing element, a photo sensing readout circuit, a light passage. Thus, any repetitive explanations concerning the same elements will be omitted.

Referring to FIG. 7, the display device includes an upper structure 1002, a lower structure 1020, and a connecting element 150. In the example embodiment, the upper structure 1002 has a width smaller than the lower structure 1020, so that an external light EL may pass through a space between adjacent upper structures 1002. The light having passed through the space between the adjacent upper structure 1002 is incident into the lower structure 1020.

The upper structure 1002 includes a display element 100. The display element 100 includes a first electrode 110, a second electrode 120, and a light emitting layer 130.

The lower structure 1020 includes a display driver circuit 170, a photo sensing element 210, and a photo sensing readout circuit 270.

The photo sensing element 210 is disposed on the photo sensing readout circuit 270, and exposed between the adjacent upper structures 1002 to sense the external light EL. In the example embodiment, the photo sensing element 210 includes various photo sensing elements such as a photo diode, a photo gate, etc., to generate an electric signal.

The photo sensing readout circuit 270 receives the electric signal generated from the photo sensing element 210 to output a photo sensing signal.

The display driver circuit 170 is disposed on the same layer as the photo sensing readout circuit 270.

According to the example embodiment, the photo sensing element 210 is disposed on a different layer from the display element 100 which is physically separated. Thus, noise caused by a display output light IL generated from the display element 100 may be minimized.

Figure 8:
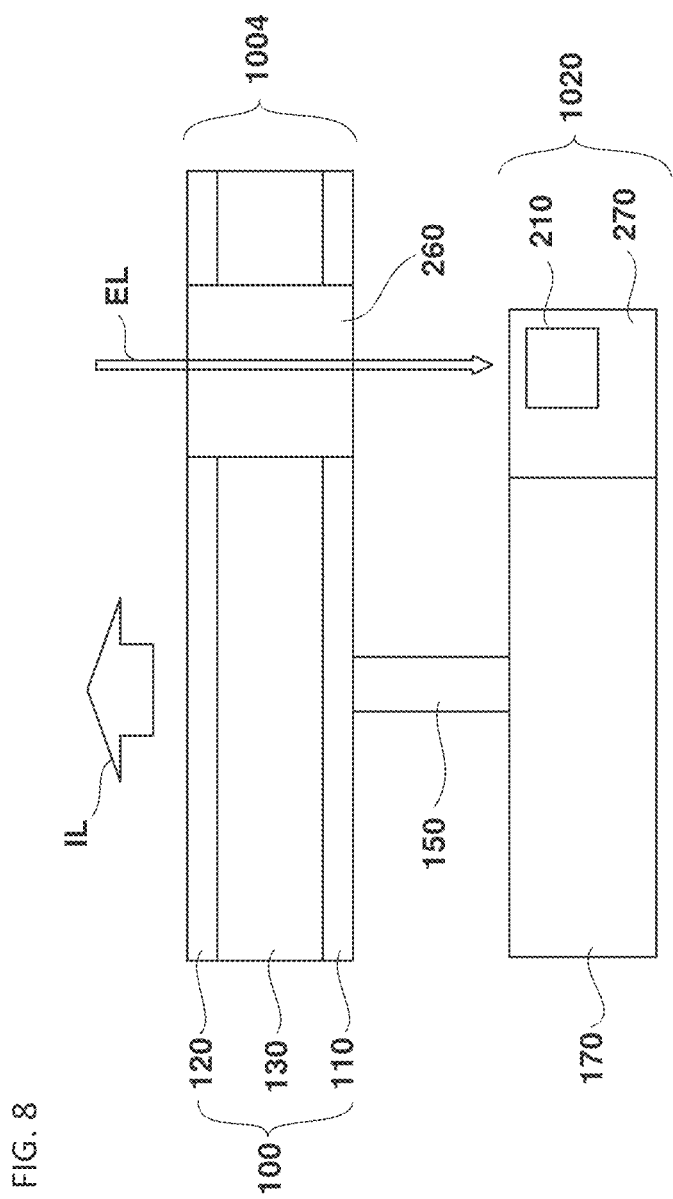
FIG. 8 is a cross-sectional view illustrating a display device according to another example embodiment of the present invention.

FIG. 8 is a cross-sectional view illustrating a display device according to another example embodiment of the present invention. The display device of FIG. 8 is substantially the same as shown in FIG. 7 except a light guide. Thus, any repetitive explanations concerning the same elements will be omitted.

Referring to FIG. 8, the display device includes an upper structure 1004, a lower structure 1020, and a connecting element 150.

The upper structure 1004 includes a display element 100 and a light guide 260.

The light guide 260 is disposed between adjacent display elements 100 to guide an external light toward the photo sensing element 210.

The light guide 260 includes a transparent solid material. For example, the light guide 260 may include a material having refractivity greatly different from that of the display element 100. When the difference between the refractivity of the light guide 260 and the display element 100 is high, the external light EL is totally reflected from an inner surface of the light guide 260 to improve sensing efficiency of the photo sensing element 210.

Figure 9:
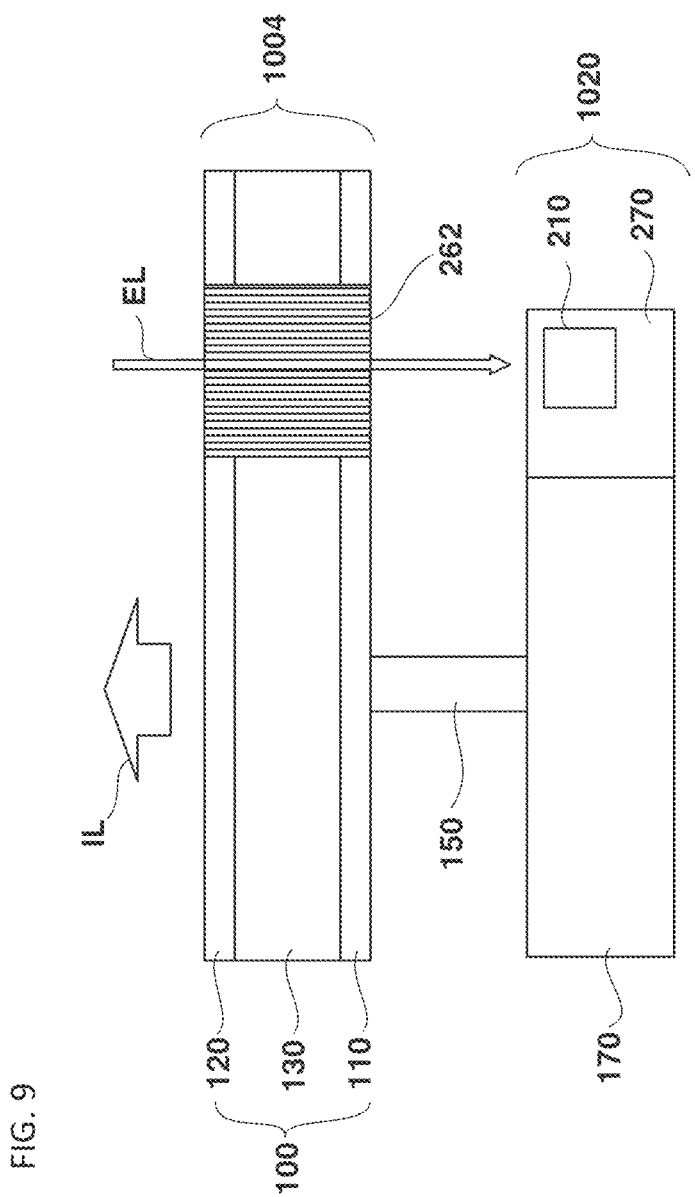
FIG. 9 is a cross-sectional view illustrating a display device according to another example embodiment of the present invention.

FIG. 9 is a cross-sectional view illustrating a display device according to another example embodiment of the present invention. The display device of FIG. 9 is substantially the same as shown in FIG. 8 except a light guide. Thus, any repetitive explanations concerning the same elements will be omitted.

Referring to FIG. 9, the light guide 262 includes a light tube assembly. For example, optical fiber, glass fiber, synthetic resin fiber, etc., are arranged in a vertical direction to form the light guide 262.

Figure 10:
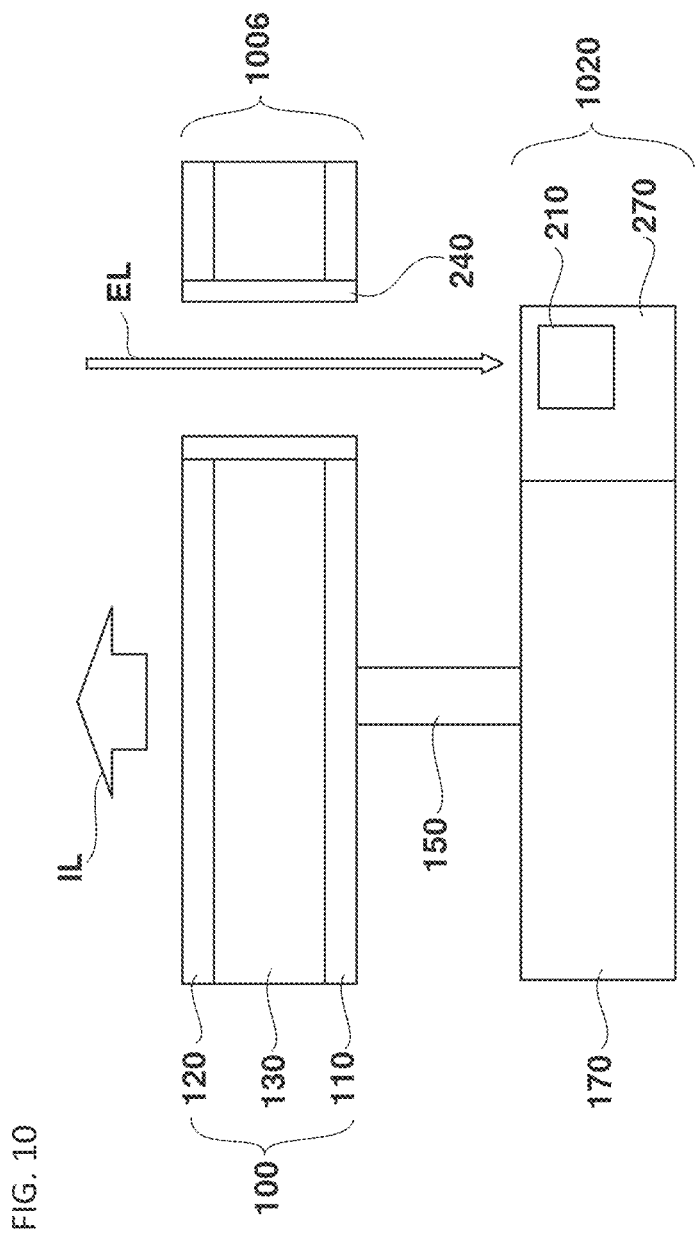
FIG. 10 is a cross-sectional view illustrating a display device according to another example embodiment of the present invention.

FIG. 10 is a cross-sectional view illustrating a display device according to another example embodiment of the present invention. The display device of FIG. 10 is substantially the same as shown in FIG. 7 except a light shield layer. Thus, any repetitive explanations concerning the same elements will be omitted.

Referring to FIG. 10, the display device includes an upper structure 1006, a lower structure 1020, and a connecting element 150. In the example embodiment, the upper structure 1006 has a width smaller than the lower structure 1020 to transmit an external light EL between adjacent upper structures 1006.

The upper structure 1006 includes a display element 100 and a light shield layer 240.

The light shield layer 240 covers a side surface of the display element 100 to prevent leakage of a display output light IL generated from the display element 100.

The light shield layer 240 includes a material having high reflectivity or high light absorbing characteristics to have high light shield characteristics. For example, the light shield layer 240 may include metal, metal oxide, metal oxynitride, opaque synthetic resin, etc. When the light shield layer 240 includes metal, an insulating layer (not shown) may be interposed between the light shield layer 240 and the display element 100.

According to the example embodiment, the light shield layer 240 blocks the light leaked from the display element 100 to improve sensing accuracy of the photo sensing element 210.

Figure 11:
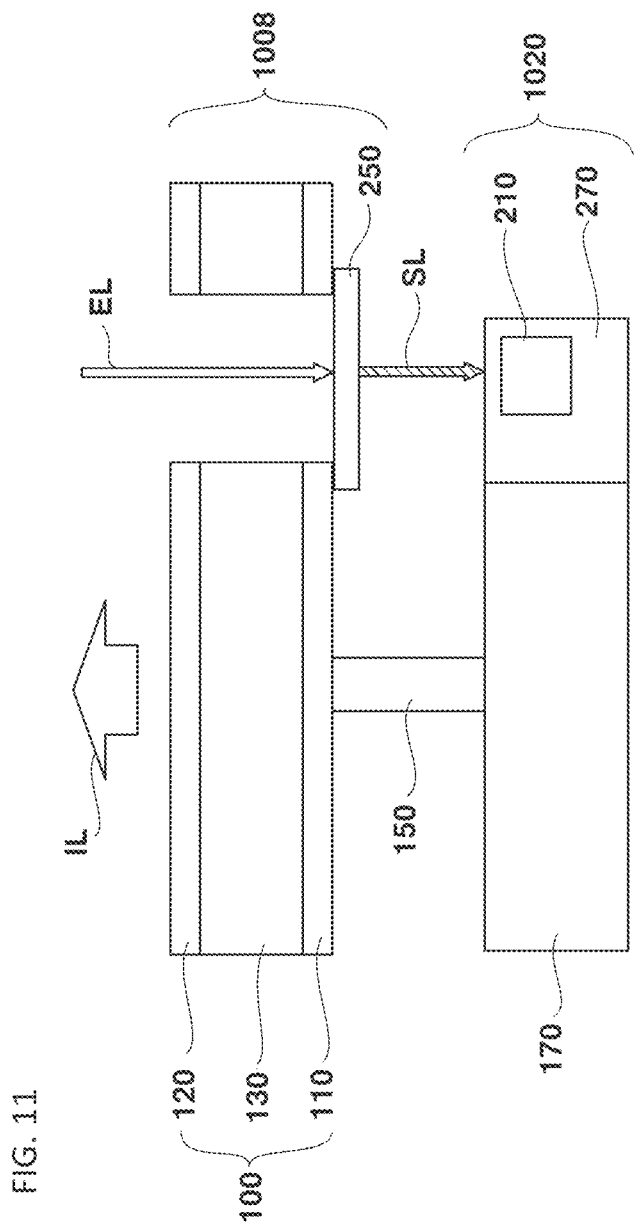
FIG. 11 is a cross-sectional view illustrating a display device according to another example embodiment of the present invention.

FIG. 11 is a cross-sectional view illustrating a display device according to another example embodiment of the present invention. The display device of FIG. 11 is substantially the same as shown in FIG. 7 except an optical filter. Thus, any repetitive explanations concerning the same elements will be omitted.

Referring to FIG. 11, the display device includes an upper structure 1008, a lower structure 1020, and a connecting element 150. In the example embodiment, the upper structure 1008 has a width smaller than that of the lower structure 1020 to transmit an external light EL between adjacent upper structures 1008.

The upper structure 1008 includes a display element 100 and an optical filter 250. The optical filter 250 is disposed on a layer lower than or equal to a first electrode 110 between adjacent display elements 100.

In the example embodiment, the optical filter 250 filters the external light EL to emit a selected input light SL toward a photo sensing element 210. For example, the optical filter 250 filters a light having the same wavelength as the light generated from the display element 100, and may transmit a light having a wavelength in a sensing range of the photo sensing element 210.

The optical filter 250 may include a fluorescent material or a material blocking a light of a predetermined wavelength, or may be formed by stacking materials having different refractivity. For example, the optical filter 250 may include a fluorescent filter, or various optical members such as a dual brightness enhancement film (DBEF) formed by stacking materials having different refractivity, an anisotropic conductive film (ACF), a transparent conductive film (TCTF), etc.

When the optical filter 250 includes a fluorescent material, the display device may generate a light having a predetermined wavelength range to be used for a experimental equipment, etc. For example, the display device may be used for a genetic experimental equipment using radioactive isotope.

According to the example embodiment, the upper structure 1008 includes the optical filter 250 to decrease noise caused by the display element 100 and improve sensing efficiency of the external light EL.

Figure 12:
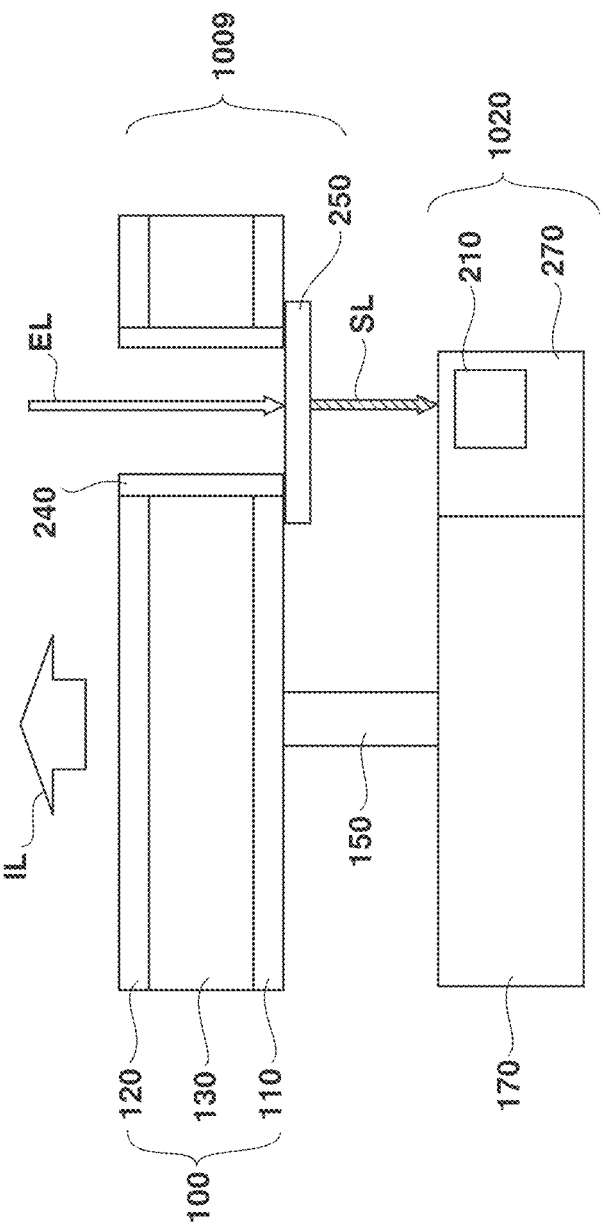
FIG. 12 is a cross-sectional view illustrating a display device according to another example embodiment of the present invention.

FIG. 12 is a cross-sectional view illustrating a display device according to another example embodiment of the present invention. The display device of FIG. 12 is substantially the same as shown in FIG. 10 except an optical filter. Thus, any repetitive explanations concerning the same elements will be omitted.

Referring to FIG. 12, an upper structure 1009 includes a display element 100, a light shield layer 240, and an optical filter 250.

According to the example embodiment, the light shield layer 240 is combined with the optical filter 250 to minimize the noise caused by the display element 100 and improve sensing efficiency of the external light EL.

Figure 13:
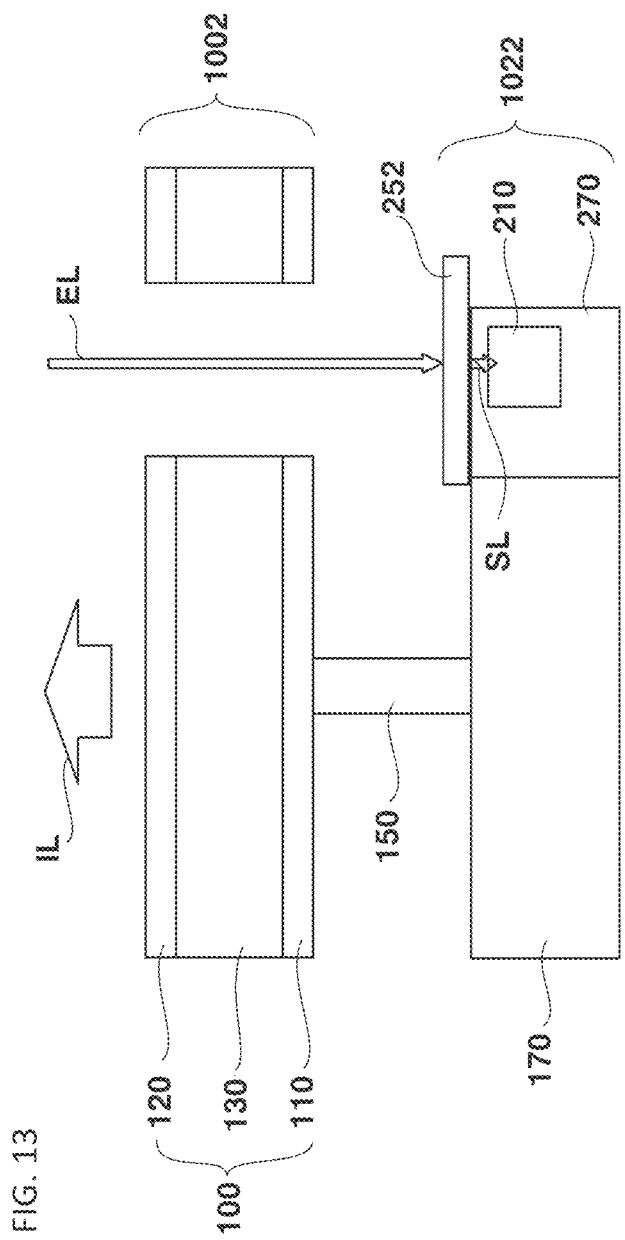
FIG. 13 is a cross-sectional view illustrating a display device according to another example embodiment of the present invention.

FIG. 13 is a cross-sectional view illustrating a display device according to another example embodiment of the present invention. The display device of FIG. 11 is substantially the same as shown in FIG. 7 except a location of an optical filter. Thus, any repetitive explanations concerning the same elements will be omitted.

Referring to FIG. 13, the display device includes an upper structure 1002, a lower structure 1022, and a connecting element 150. In the example embodiment, the upper structure 1002 has a width smaller than that of the lower structure 1022 to transmit an external light EL between adjacent upper structures 1002.

The lower structure 1022 includes a display driver circuit 170, a photo sensing element 210, a light sensing readout circuit 270, and an optical filter 252.

In the example embodiment, the optical filter 255 is attached to the photo sensing element 210.

According to the embodiment of the present invention, the optical filter 255 is included in the lower structure 1022, so that a manufacturing process of the display element 100 may be simplified.

Figure 14:
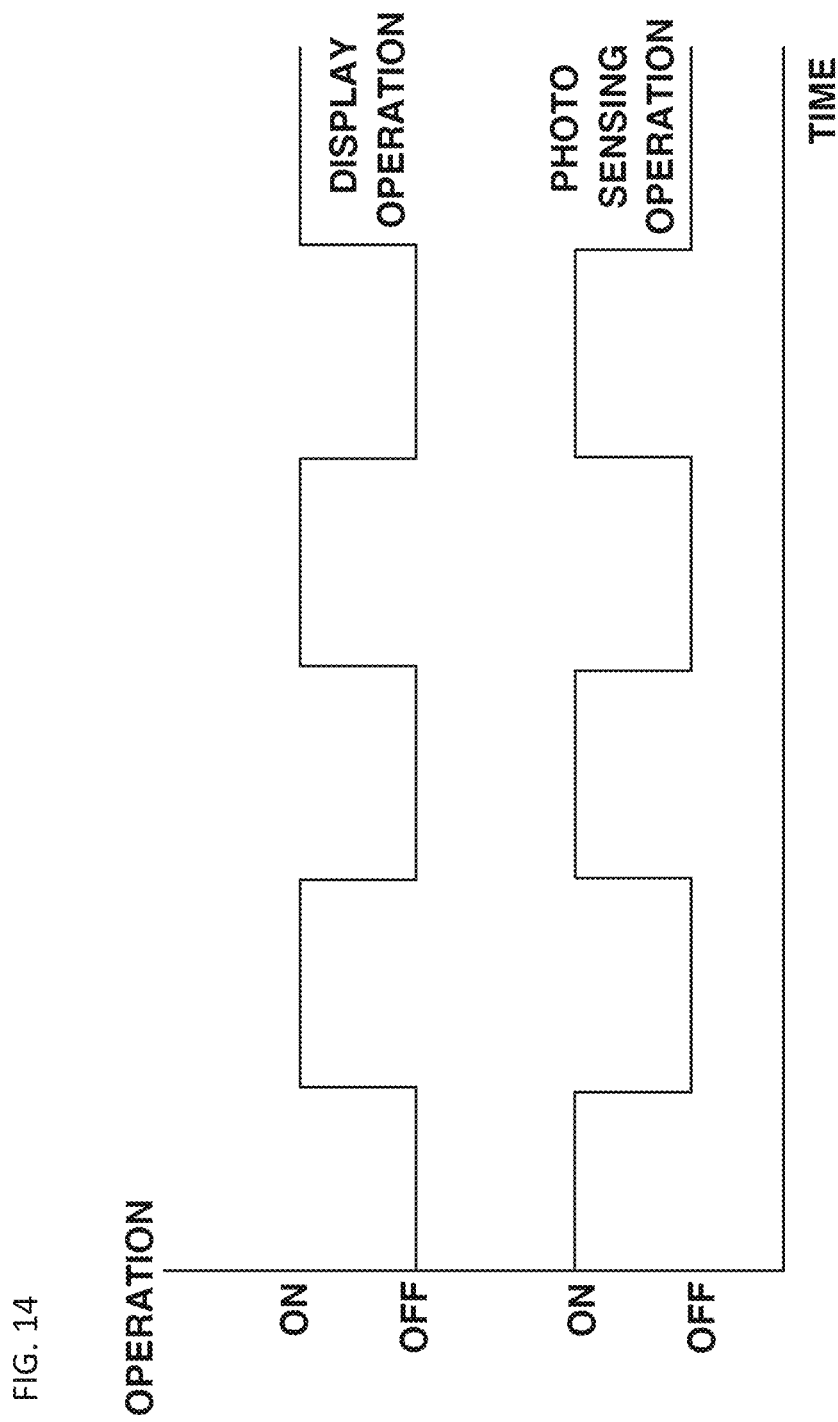
FIG. 14 is a graph illustrating a method of driving a display device according to one example embodiment of the present invention.

FIG. 14 is a graph illustrating a method of driving a display device according to one example embodiment of the present invention. The display device of FIG. 14 is substantially the same as shown in FIGS. 1 to 13. Thus, any repetitive explanations concerning the same elements will be omitted.

Referring to FIGS. 7 and 14, a display operation and a photo sensing operation of the display device are alternately performed. For example, a photo sensing element 210 is stopped (OFF) during a display element 100 is operated (ON), and the photo sensing element 210 is operated (ON) during the display element is stopped (OFF). Here, a time at which the operations of the display element 100 and the photo sensing element 210 are alternating may be variously changed. For example, the time during which the display element 100 is operated (ON) may be longer or shorter than the time during which the photo sensing element 210 is operated (ON). Also, after the display element 100 is operated (ON) and stopped (OFF), a predetermined time has passed, and then the photo sensing element 210 may be operated. Also, the opposite case to the above may also be possible.

However, according to the example embodiment, the display device may include various structural elements such as a light shield layer 240, an optical filter 250, a light guide 260, etc., so that the display element 100 may be simultaneously operated with the photo sensing element 210.

According to the example embodiment, the times at which the display element 100 and the photo sensing element 210 are operated (ON) are alternately arranged to remove a noise caused by the display element 100 and improve sensing accuracy of the photo sensing element 210.

Figure 15:
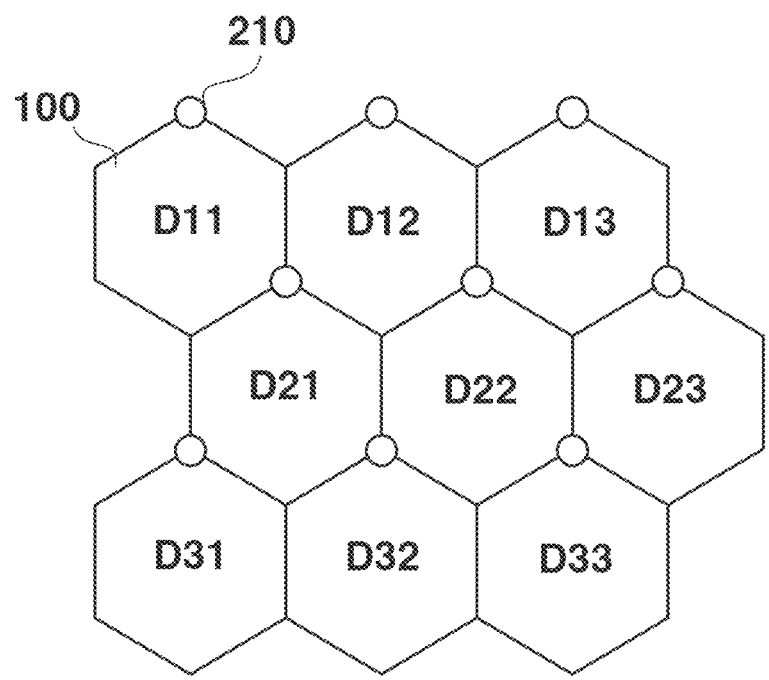
FIG. 15 is a plan view illustrating a display device according to one example embodiment of the present invention.

FIG. 15 is a plan view illustrating a display device according to one example embodiment of the present invention. The display device of FIG. 15 is substantially the same as shown in FIGS. 1 to 14 except an arrangement of display elements and photo sensing elements. Thus, any repetitive explanations concerning the same elements will be omitted.

Referring to FIGS. 7 and 15, the display elements 100 are arranged in a hexagonal array shape.

The photo sensing elements 210 correspond to the display elements 100, respectively, and are disposed between adjacent display elements 100.

According to the example embodiment, the display elements 100 are arranged in the hexagonal array shape to maximize opening ratio, thereby improving image display quality. Also, the photo sensing elements 210 are arranged in the hexagonal array shape, to easily compensate an error caused by a defected element using data of adjacent element.

Figure 16:
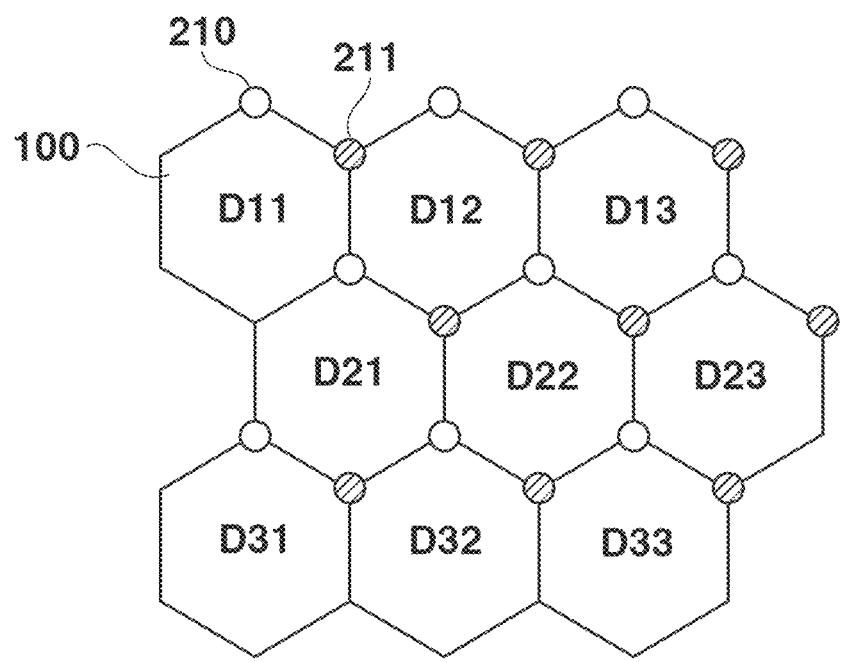
FIG. 16 is a plan view illustrating a display device according to another example embodiment of the present invention.

FIG. 16 is a plan view illustrating a display device according to another example embodiment of the present invention. The display device of FIG. 16 is substantially the same as shown in FIG. 15 except the number of display elements. Thus, any repetitive explanations concerning the same elements will be omitted.

Referring to FIGS. 7 and 16, a main photo sensing element 210 and a sub photo sensing element 211' are disposed in each display element 100.

In the example embodiment, the main photo sensing element 210 and the sub photo sensing element 211' are connected to one photo sensing readout circuit 270, and may use the photo sensing readout circuit 270 divided into two parts.

According to the example embodiment, although the photo sensing elements 210 and 211' are defected, data may be easily compensated using data of adjacent photo sensing element.

Figure 17:
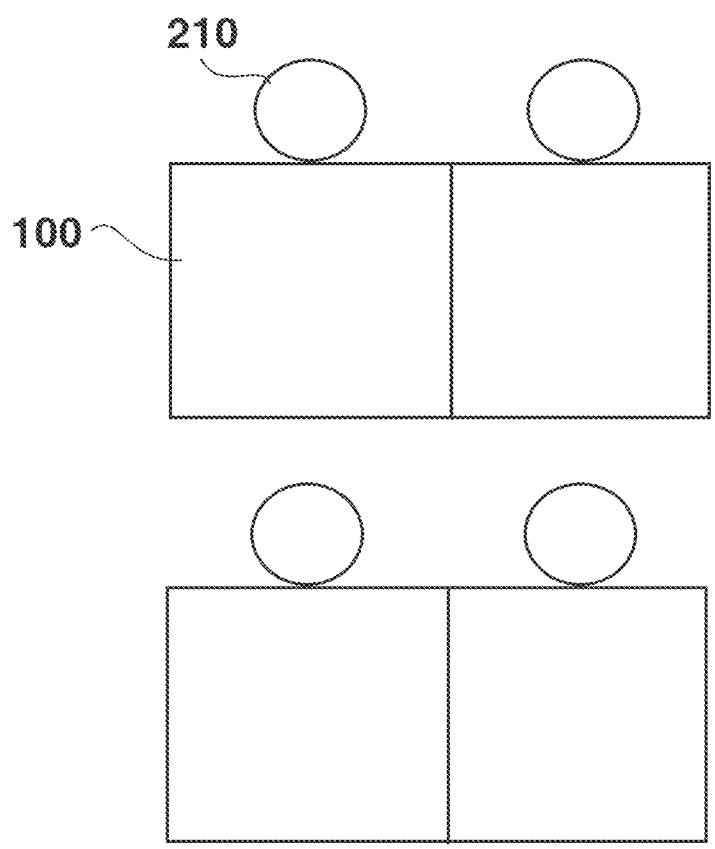
FIG. 17 is a plan view illustrating a display device according to another example embodiment of the present invention.

FIG. 17 is a plan view illustrating a display device according to another example embodiment of the present invention. The display device of FIG. 17 is substantially the same as shown in FIGS. 1 to 16 except an arrangement of display elements and photo sensing elements. Thus, any repetitive explanations concerning the same elements will be omitted.

Referring to FIG. 17, the display elements are arranged in a matrix shape.

The photo sensing elements 210 correspond to upper portions of the display elements 100, respectively.

Figure 18:
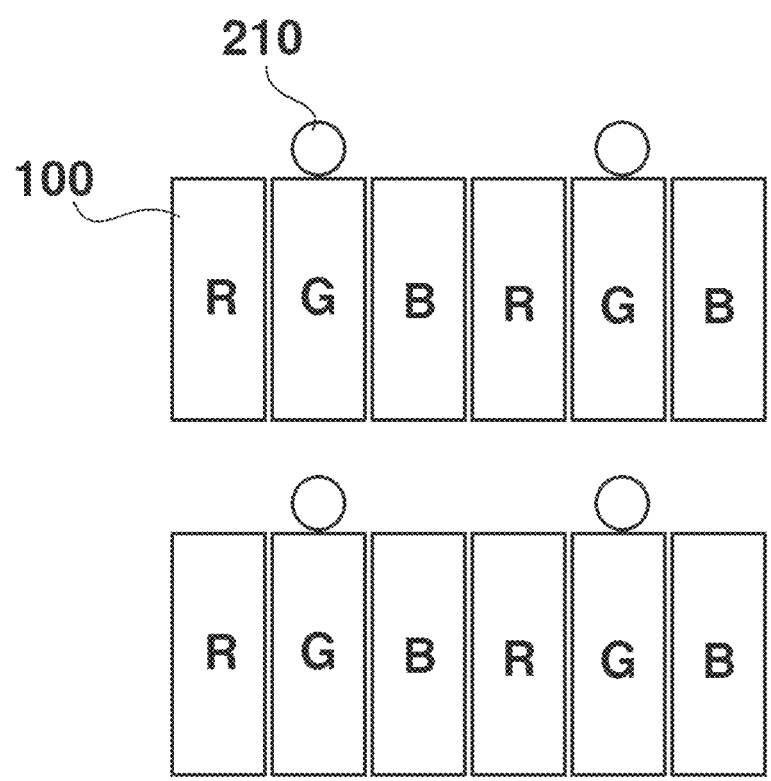
FIG. 18 is a plan view illustrating a display device according to another example embodiment of the present invention.

FIG. 18 is a plan view illustrating a display device according to another example embodiment of the present invention. The display device of FIG. 18 is substantially the same as shown in FIGS. 1 to 17 except an arrangement of display elements and photo sensing elements. Thus, any repetitive explanations concerning the same elements will be omitted.

Referring to FIG. 18, the display elements 100 are arranged in a matrix shape corresponding to three primary colors R, G, and B.

The photo sensing elements 210 correspond to upper portions of display elements 100 corresponding to green colors among the display elements 100, respectively.

Figure 19:
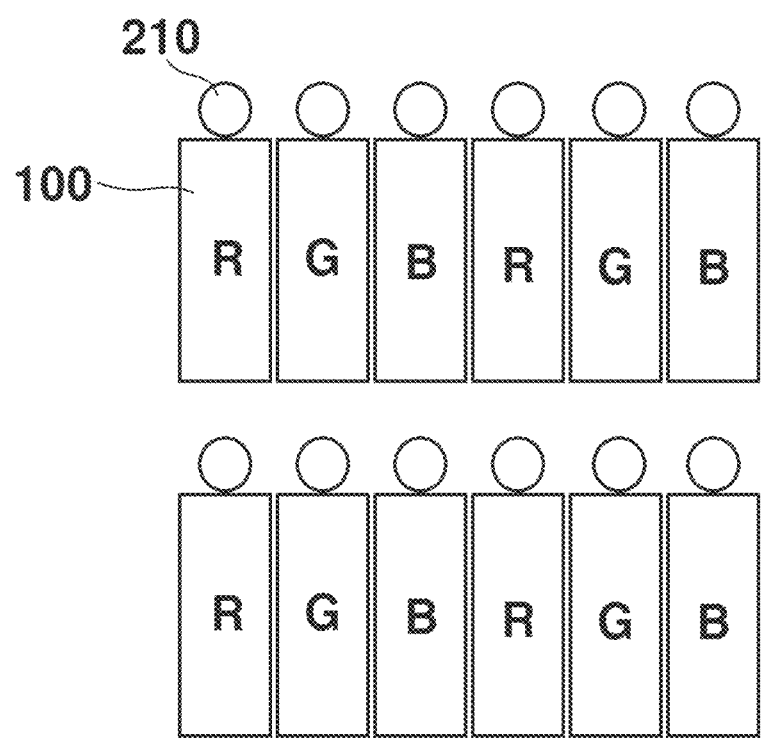
FIG. 19 is a plan view illustrating a display device according to another example embodiment of the present invention.

FIG. 19 is a plan view illustrating a display device according to another example embodiment of the present invention. The display device of FIG. 19 is substantially the same as shown in FIGS. 1 to 18 except an arrangement of display elements and photo sensing elements. Thus, any repetitive explanations concerning the same elements will be omitted.

Referring to FIG. 19, the display elements 100 are arranged in a matrix shape corresponding to three primary colors R, G, and B.

The photo sensing elements 210 correspond to upper portions of the display elements 100, respectively.

According the above, the display elements 100 and the photo sensing elements 210 may be variously arranged.

Figure 20:
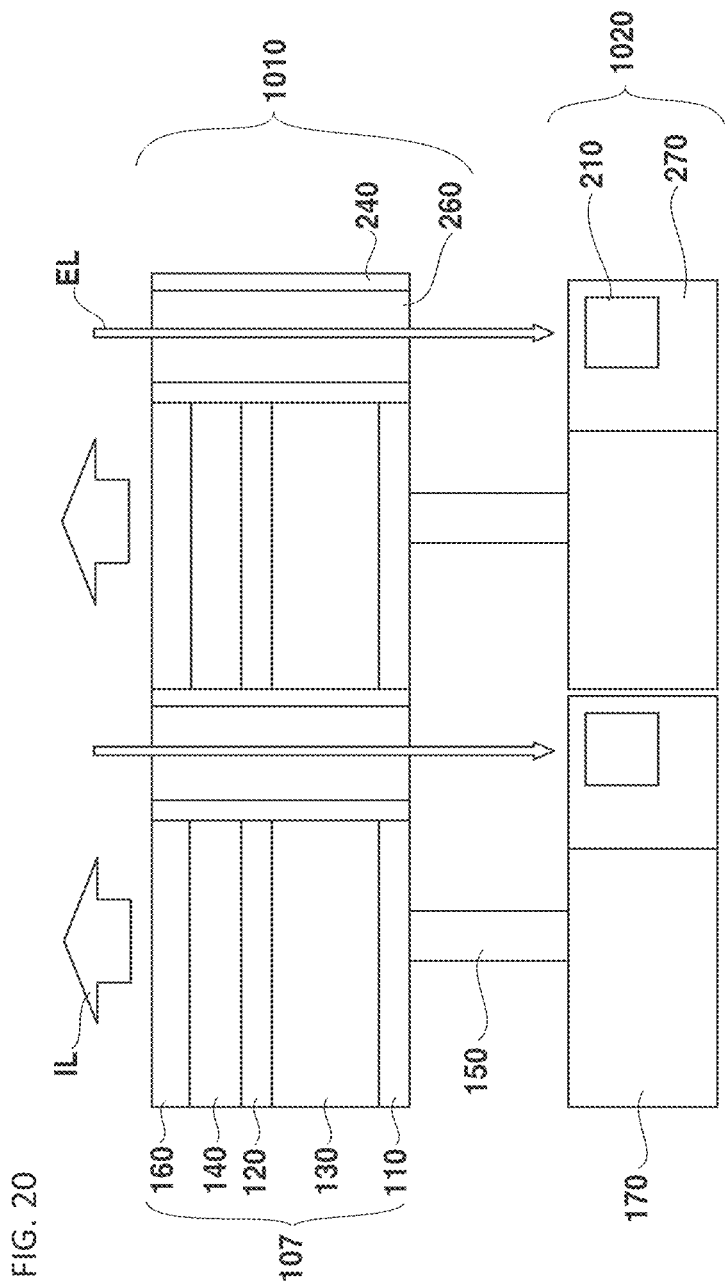
FIG. 20 is a cross-sectional view illustrating a display device according to another example embodiment of the present invention.

FIG. 20 is a cross-sectional view illustrating a display device according to another example embodiment of the present invention. The display device of FIG. 20 is substantially the same as shown in FIGS. 1 to 19 except a photo change layer, a color filter, an optical guide, and a light shield layer. Thus, any repetitive explanations concerning the same elements will be omitted.

Referring to FIG. 20, an upper structure 1010 includes a display element 107, a light shield layer 240, and a light guide 260.

The display element 106 includes a first electrode 110, a second electrode 120, a light emitting layer 130, a photo change layer 140, and a color filter 160.

The photo change layer 140 changes optical characteristics of light generated from the light emitting layer 130. In the example embodiment, the light emitting layer 130 may generate a bluish light or a ultraviolet, and include phosphorescent material, fluorescent material, etc., to change wavelength of light generated from the light emitting layer 130, thereby generating visible light.

In the example embodiment, the bluish light or the ultraviolet light is out of a sensing range of the photo sensing element 210.

The color filter 160 filters the visible light generated from the photo change layer 140 to emit primary color lights such as red, green, blue, etc., as a display output light.

According to the example embodiment, the light emitting layer 130 generates the light out of the sensing range of the photo sensing element 210 to decrease sensing error caused by leakage of light.

Figure 21:
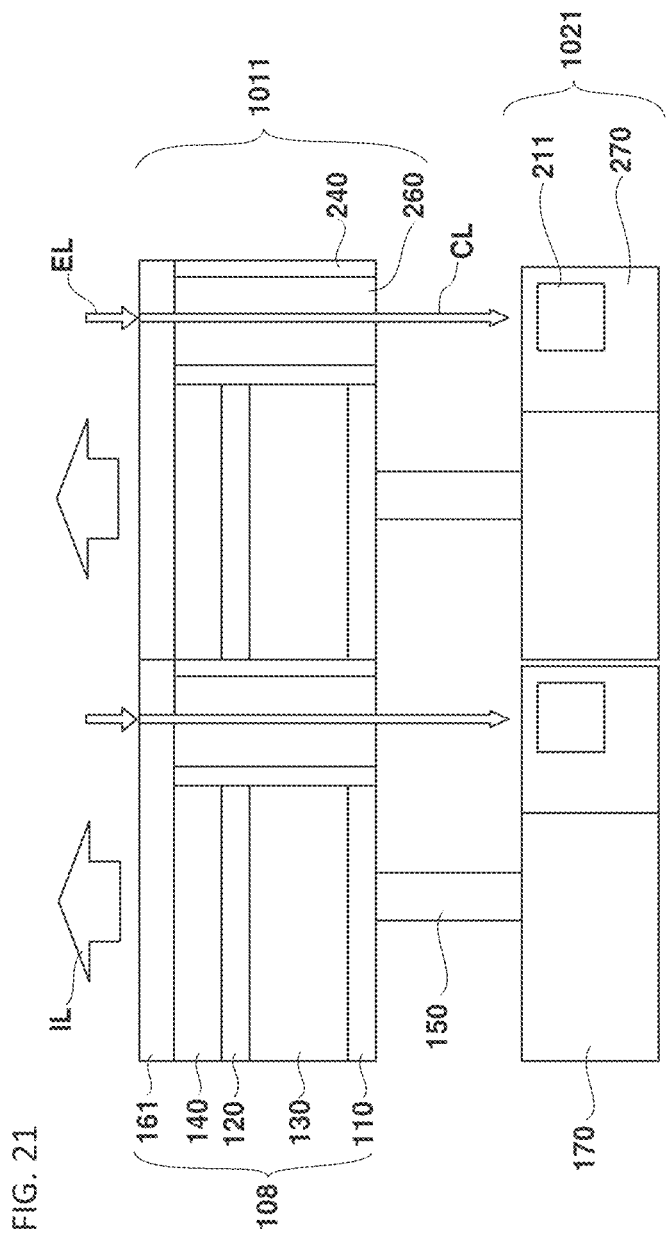
FIG. 21 is a cross-sectional view illustrating a display device according to another example embodiment of the present invention.

FIG. 21 is a cross-sectional view illustrating a display device according to another example embodiment of the present invention. The display device of FIG. 21 is substantially the same as shown in FIG. 20 except a photo change layer, a color filter, an optical guide, and a light shield layer. Thus, any repetitive explanations concerning the same elements will be omitted.

Referring to FIG. 21, the display device includes an upper structure 1011, a lower structure 1021, and a connecting element 150.

The upper structure 1011 includes a display element 108, a light shield layer 240, and a light guide 260.

The display element 108 includes a first electrode 110, a second electrode 120, a light emitting layer 130, a photo change layer 140, and a color filter 151.

In the example embodiment, the color filter 151 is extended in a region corresponding to the photo sensing element 210 as well as a region corresponding to the display element 108.

The color filter 151 filters visible light generated by the photo change layer 140 to emit primary color lights such as red, green, blue, etc., as a display output light. In the example embodiment, the color filter 151 filters an external light EL to emit primary color lights CL such as red, green, blue, etc., toward the photo sensing element 211.

The photo sensing element 211 of the lower structure 1021 has a sensing range corresponding to the primary color light CL of each color filter 151.

According to the example embodiment, the photo sensing element 211 only senses the primary color light CL having passed through the color filter 151. Thus, the photo sensing element 211 may sense color light.

Figure 22:
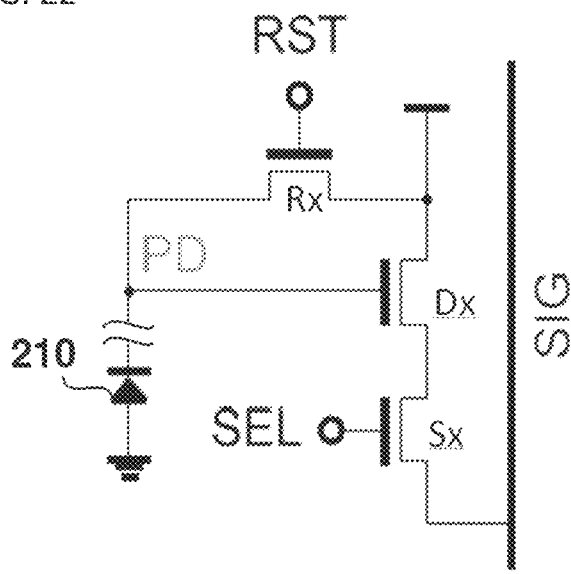
FIG. 22 is a circuit view illustrating a photo sensing readout circuit according to one example embodiment of the present invention.

FIG. 22 is a circuit view illustrating a photo sensing readout circuit according to one example embodiment of the present invention. The photo sensing readout circuit may be applied to the display device shown in FIGS. 1 to 21. Thus, any repetitive explanations concerning the same elements will be omitted.

Referring to FIGS. 7 and 22, the photo sensing readout circuit 270 includes a reset control electrode RST, a driving transistor Dx, a reset transistor Rx, a select transistor Sx, and a signal line SIG.

An electric signal generated from external light sensed by the photo sensing element 210 is applied to the reset transistor Rx and the driving transistor Dx through a first node PD of the photo sensing readout circuit 270.

The driving transistor Dx output a reference voltage using the electric signal received through the first node PD as a control signal.

The reset transistor Rx initializes the driving transistor Dx using a reset signal applied through the reset control electrode RST. The driving transistor Dx is initialized to minimize noise.

The select transistor Sx transmits a reference voltage output from the driving transistor Dx to the signal line SIG using a select signal received through the select control electrode SEL.

According to the example embodiment, the photo sensing readout circuit 270 includes the reset transistor Rx and the select transistor Sx to decrease noise and improve sensing accuracy.

Figure 23:
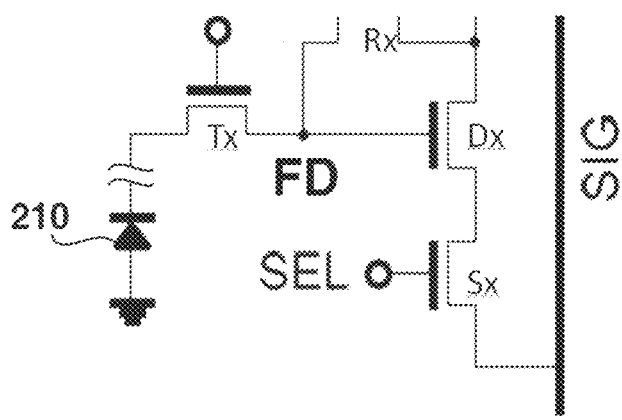
FIG. 23 is a circuit view illustrating a photo sensing readout circuit according to another example embodiment of the present invention.

FIG. 23 is a circuit view illustrating a photo sensing readout circuit according to another example embodiment of the present invention. The display device of FIG. 23 is substantially the same as shown in FIG. 22 except a transfer transistor. Thus, any repetitive explanations concerning the same elements will be omitted.

Referring to FIGS. 7, 22, and 23, the photo sensing readout circuit 270 includes a transfer transistor Tx, a reset control electrode RST, a driving transistor Dx, a reset transistor Rx, a select transistor Sx, and a signal line SIG.

An electric signal generated from external light by a photo sensing element 210 is applied to a reset transistor Rx and a driving transistor Dx through a transfer transistor of the photo sensing readout circuit 270 and a second node FD.

The transfer transistor Tx outputs the electric signal generated by the photo sensing element 210 using a transfer signal applied through a transfer control electrode TX. The transfer transistor Tx controls input of the electric signal to the driving transistor Dx.

According to the example embodiment, the photo sensing readout circuit 270 includes the transfer transistor Tx to control input of the electric signal to the driving transistor Dx, thereby decreasing noise and improving sensing accuracy.

Figure 24:
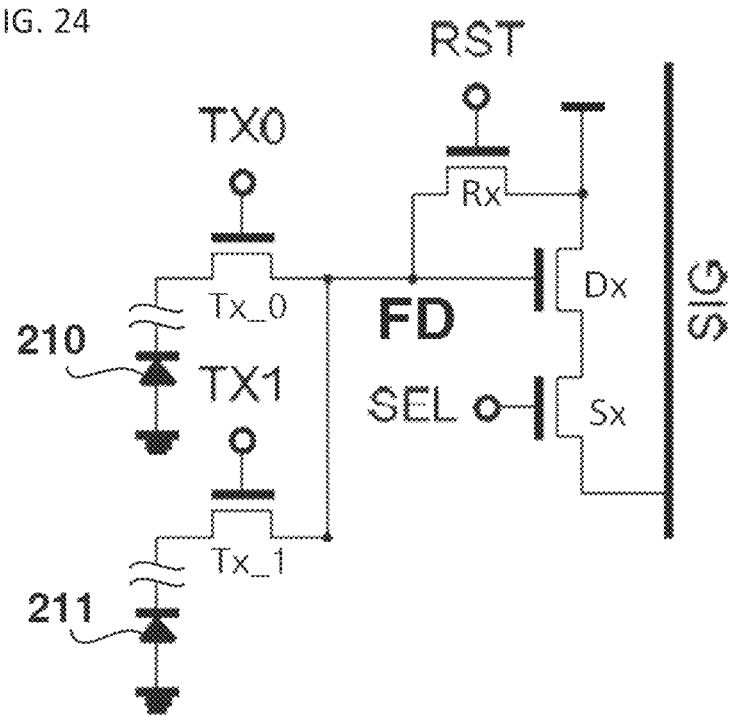
FIG. 24 is a circuit view illustrating a photo sensing readout circuit according to another example embodiment of the present invention.

FIG. 24 is a circuit view illustrating a photo sensing readout circuit according to another example embodiment of the present invention. The photo sensing readout circuit of FIG. 24 may be applied to the display device shown in FIG. 16. Thus, any repetitive explanations concerning the same elements will be omitted.

Referring to FIGS. 16 and 24, the photo sensing readout circuit 270 includes a first transfer transistor Tx_0, a second transfer transistor Tx_1, a reset control electrode RST, a driving transistor Dx, a reset transistor Rx, a select transistor Sx, and a signal line SIG An electric signal generated from external light by the main photo sensing element 210 is applied to the reset transistor Rx and the driving transistor Dx through the first transistor Tx_0 of the photo sensing readout circuit 270 and a second node FD.

The first transfer transistor Tx_0 outputs the electric signal generated by the main photo sensing element 210 using a first transfer signal applied through the first transfer control electrode TX0. The first transfer transistor Tx_0 controls input of the electric signal to the driving transistor Dx.

The electric signal generated from the external light by a sub photo sensing element 211' is applied to the reset transistor Rx and the driving transistor Dx through the second transfer transistor Tx_1 of the photo sensing readout circuit 270 and the second node FD.

The second transfer transistor Tx_1 outputs the electric signal generated by the sub photo sensing element 211' using a second transfer signal applied through a second transfer control electrode TX1. The second transfer transistor Tx_1 controls input of the electric signal to the driving transistor Dx.

According to the example embodiment, the photo sensing readout circuit 270 includes the plurality of transfer transistors Tx_0 and Tx_1, so that the electric signals generated from the plurality of photo sensing elements 210 and 211' are easily transformed into photo sensing signals.

FIGS. 25 to 33 are images illustrating a method of manufacturing the display device shown in FIG. 20. Embodiments of FIGS. 25 to 33 are substantially the same as shown in FIGS. 1 to 24. Thus, any repetitive explanations concerning the same elements will be omitted.

Figure 25:
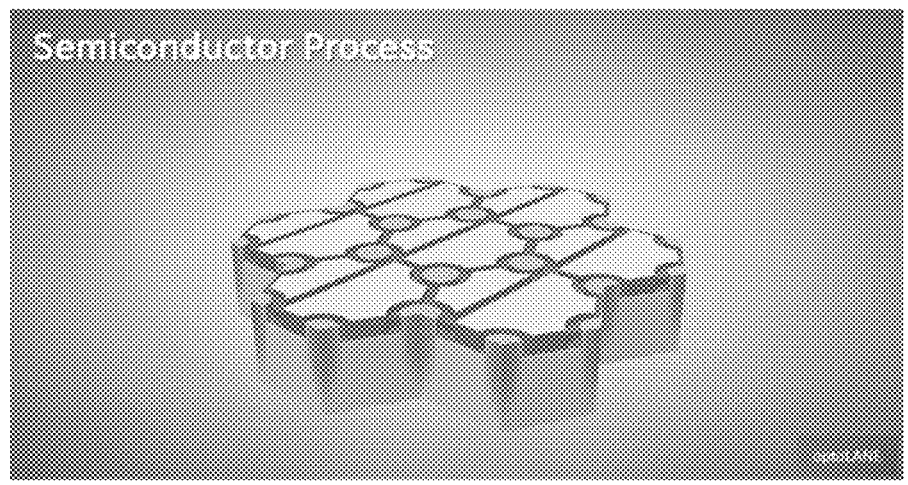
FIGS. 25 to 33 are images illustrating a method of manufacturing the display device shown in FIG. 20.
Figure 26:
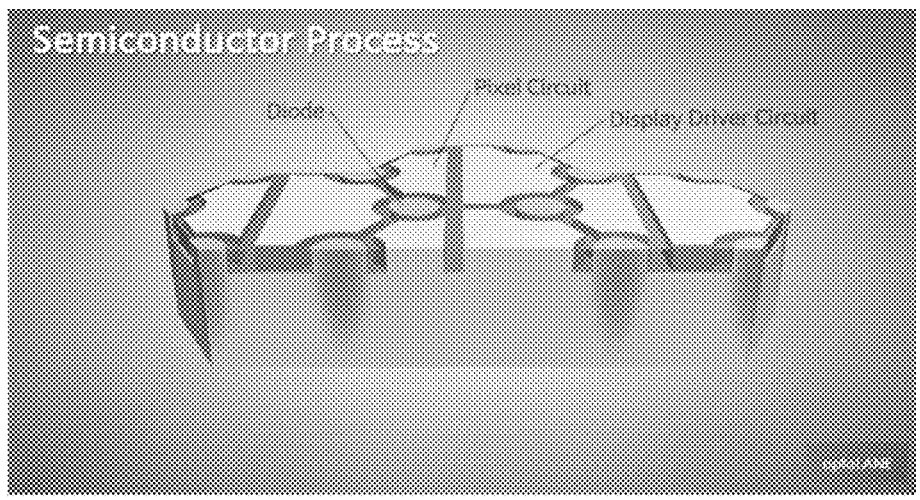

FIG. 25 is an image illustrating forming a driving circuit, a photo sensing element, and a photo sensing readout circuit. FIG. 26 is an enlarged image illustrating a portion of the image shown in FIG. 25.

Referring to FIGS. 20, 25, and 26, the display driver circuit 170, the photo sensing element 210 ('Diode'), and the photo sensing readout circuit 270 ('Pixel Circuit') are formed on a base substrate in a hexagonal array shape.

Figure 27:
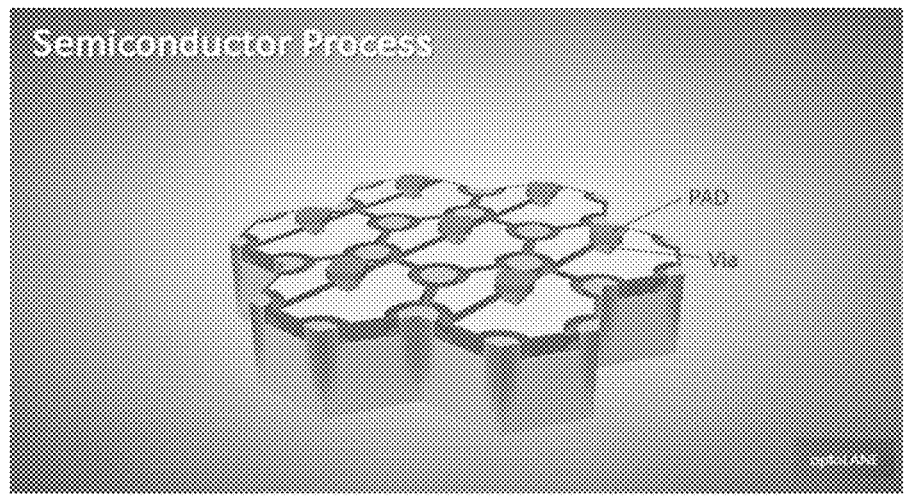

FIG. 27 is an image illustrating forming a connecting element on a display driver circuit shown in FIG. 26.

Referring to FIGS. 20 and 27, the connecting element 150 is formed on the display driver circuit 170. In the example embodiment, the connecting element 150 includes a via Via and a pad PAD disposed on the via Via.

Figure 28:
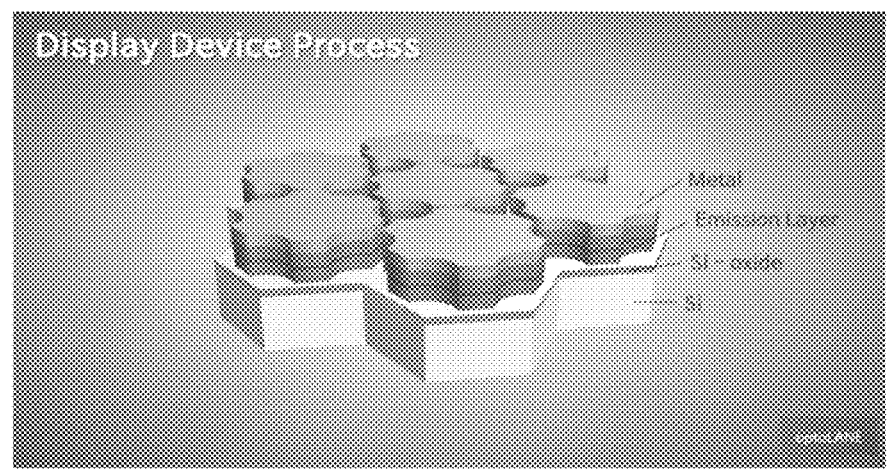

FIG. 28 is an image illustrating forming a light emitting layer and a first electrode on an additional substrate.

Referring to FIGS. 20 and 28, a silicon oxide layer Si-oxide, the light emitting layer 130 ('Emission Layer'), and the first electrode 110 are sequentially formed on an additional silicon substrate Si. In the example embodiment, the silicon oxide layer Si-oxide covers an entire surface of the silicon substrate Si, and the light emitting layer 130 ('Emission Layer') and the first electrode 110 ('Metal') have a hexagonal array shape. For example, the light emitting layer 130 ('Emission Layer') and the first electrode 110 may be formed through a photolithography process.

Alternatively, before the forming of the light emitting layer 130 ('Emission Layer'), a second electrode 120 may be formed on the silicon oxide layer Si-oxide.

Figure 29:
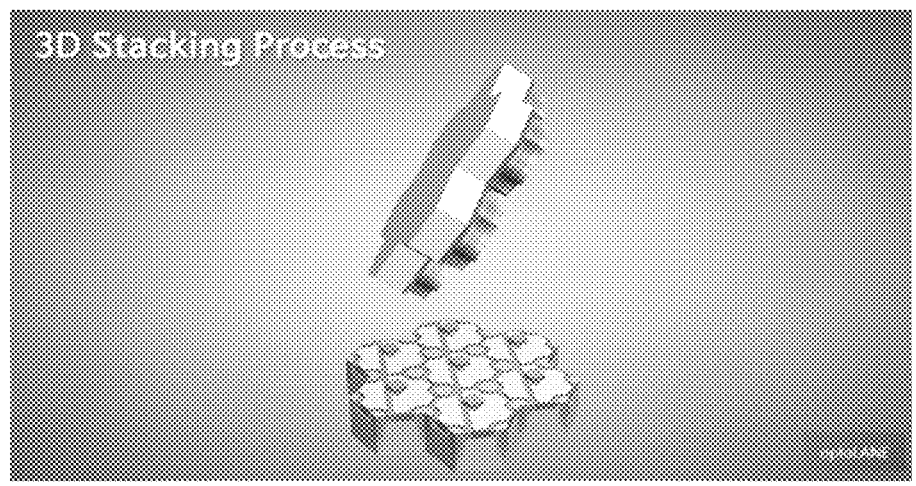

FIG. 29 is an image illustrating transporting the structure shown in FIG. 28 toward the structure shown in FIG. 27. FIG. 8 is an image illustrating combining the structure shown in FIG. 28 with the structure shown in FIG. 27.

Figure 30:
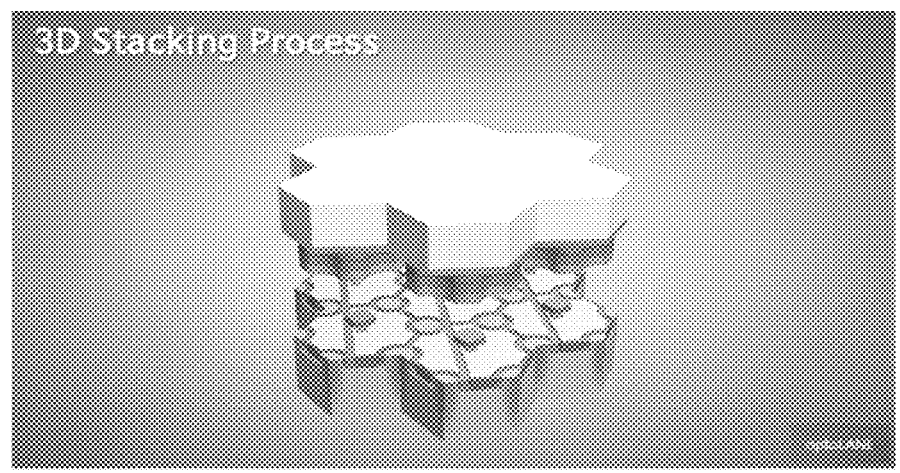

Referring to FIGS. 20, 29, and 30, the first electrode 110 formed in FIG. 28 is aligned to face the connecting element 150 of the structure formed in FIG. 27.

Then, the first electrode 110 is combined with the connecting element 150.

Figure 31:
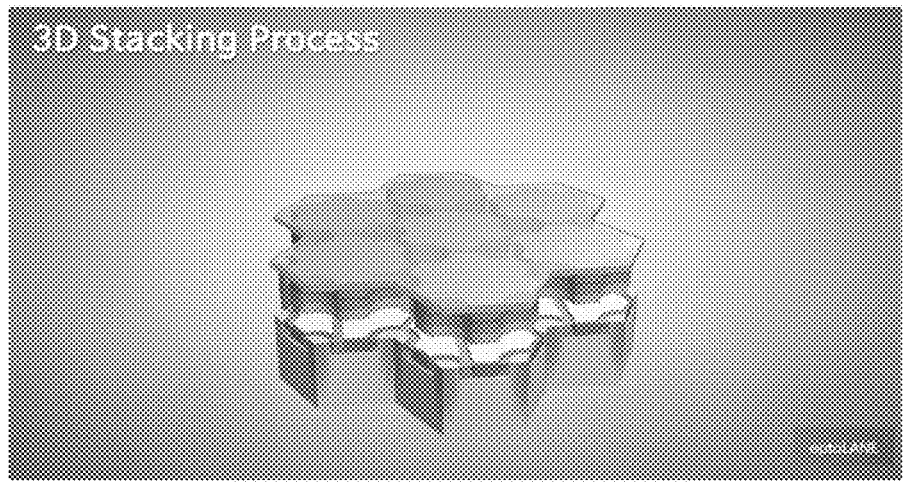

FIG. 31 is an image illustrating separating the silicon substrate from the structure shown in FIG. 30.

Referring to FIGS. 20 and 31, then, the light emitting layer 130 and the silicon substrate Si (shown in FIG. 28) to expose the silicon oxide layer ('Silicon oxide').

FIG. 32 is an image illustrating forming a second electrode on the silicon oxide layer of FIG. 31.

Referring to FIGS. 20 and 32, then, the second electrode 120 ('ITO') including hexagonal star shaped line is formed on the silicon oxide layer. For example, the second electrode 120 ('ITO') may be formed through a photolithography process.

When the second electrode 120 ('ITO') has the hexagonal star shaped line, light transmittance is improved, thereby improving luminance of the display device.

Alternatively, the second electrode may cover an entire of the silicon oxide layer, and may have various shapes such as a hexagonal shape, a quadrangular shape, a triangular shape, a slit shape, etc.

Alternatively, when the second electrode 120 is formed during the forming of the structure shown in FIG. 28, the fixing of FIG. 32 may be omitted.

Figure 33:
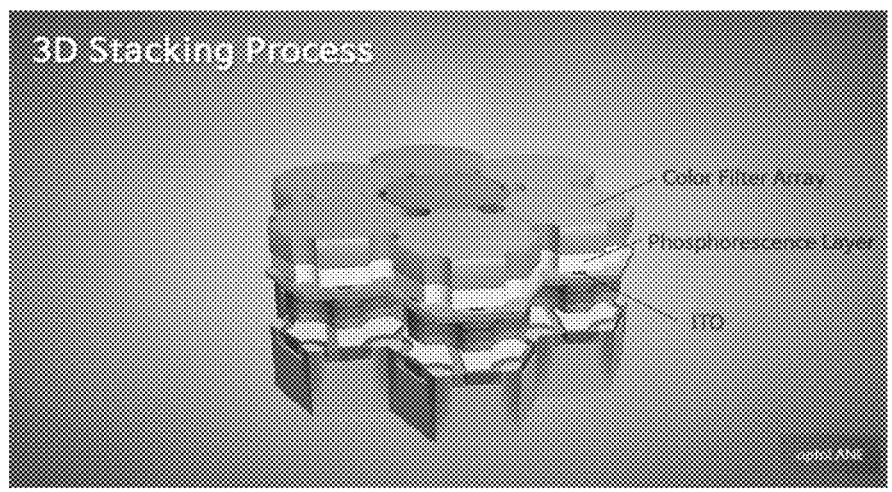

FIG. 33 is an image illustrating forming a photo change layer and a color filter on the second electrode of FIG. 31.

Referring to FIGS. 20 and 33, the photo change layer 140 ('Phosphorescence layer') and the color filter 160 ('Color Filter Array') are formed on the second electrode 120 ('ITO'), in sequence. For example, the photo change layer 140 ('Phosphorescence Layer') and the color filter 160 ('Color Filter Array') may be formed through a photolithography process.

FIGS. 34 to 38 are images illustrating a method of head mount display (HMD) interfacing according to one example embodiment of the present invention. In the example embodiment, the display device of FIGS. 34 to 38 are substantially the same as shown in FIGS. 4 to 33. Thus, any repetitive explanation concerning the above elements will be omitted. The method shown in FIGS. 34 to 38 is an example embodiment of an interfacing method using the display device according to the present invention, and is a method of sensing iris movement to control location of a cursor displayed on a display element.

Figure 34:
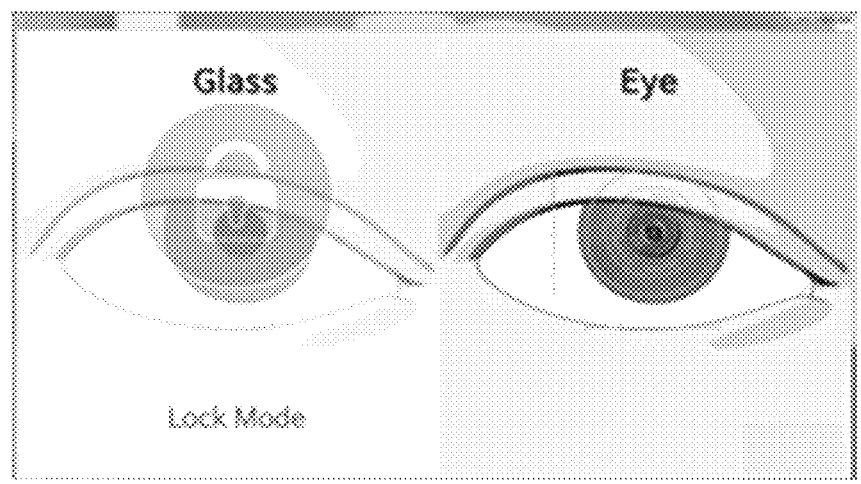
FIGS. 34 to 38 are images illustrating a method of head mount display (HMD) interfacing according to one example embodiment of the present invention.

FIG. 34 is an image illustrating releasing a lock mode by an iris recognition.

Referring to FIGS. 7 and 34, the lock mode is released by recognizing a user through the iris recognition of a user. For example, an image of an iris recognized through photo sensing elements 210 is compared with an iris image of a registered user. When the iris image is substantially the same as the iris of the registered user, a command for releasing the lock mode is determined to release the lock mode.

Figure 35:
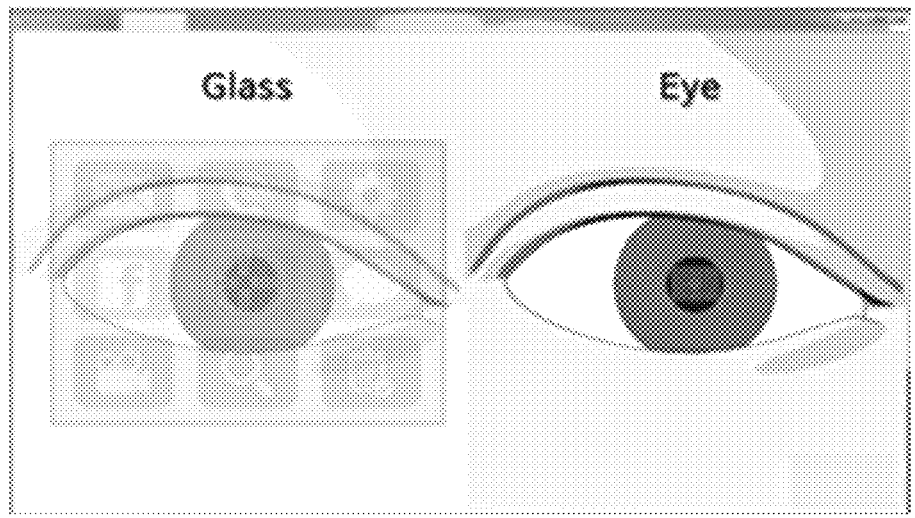

FIG. 35 is an image illustrating displaying a command icon on a display element by releasing the lock mode.

Referring to FIGS. 7 and 35, when the lock mode is released, a predetermined motion of the user such as continuously blinking twice, winking and maintaining winking, etc., during a predetermined time period, and overall command icons and the cursor are displayed on the display element 100. In the example embodiment, the cursor is transported by sensing the movement of the iris, so that the cursor may be transported to a command icon desired by the user.

Figure 36:
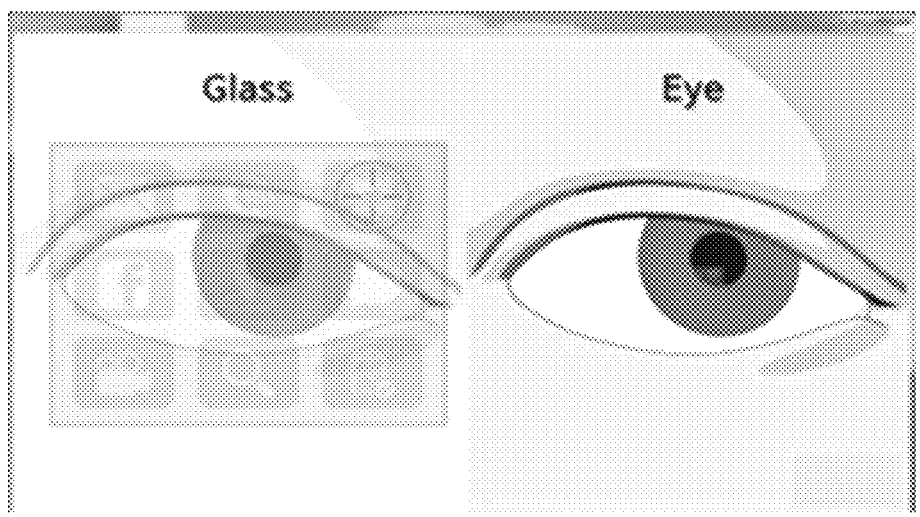

FIG. 36 is an image illustrating transporting the iris image onto the command icon to be operated.

Referring to FIGS. 7 and 36, the user moves the iris to the command icon while recognizing the iris image displayed on the display element 100 in real time. The photo sensing element 210 transforms an amount of light changed based on the movement of the iris into an electric signal. The display element 100 displays data generated corresponding to the iris image in real time. In the example embodiment, the iris image displayed on the display element 100 may be used as a cursor.

Figure 37:
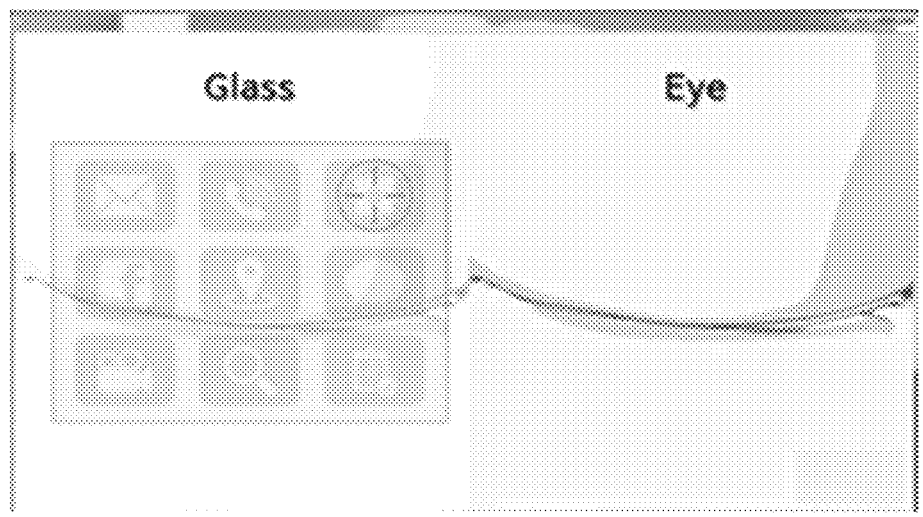

FIG. 37 is an image illustrating inputting a command corresponding to the command icon on which the iris image is displayed.

Referring to FIGS. 7 and 37, a command corresponding to a command icon overlapped with the iris image is input. In the example embodiment, the user inputs a command by continuously blinking two or more times. Alternatively, when the iris image is disposed on the command icon for more than a predetermined time period (for example, more than 3 seconds), the above iris image may be recognized as an input of the command.

In the example embodiment, when the command is input, a select icon is generated to be displayed on the display element 100 or an operation indicated by the select icon is performed.

Figure 38:
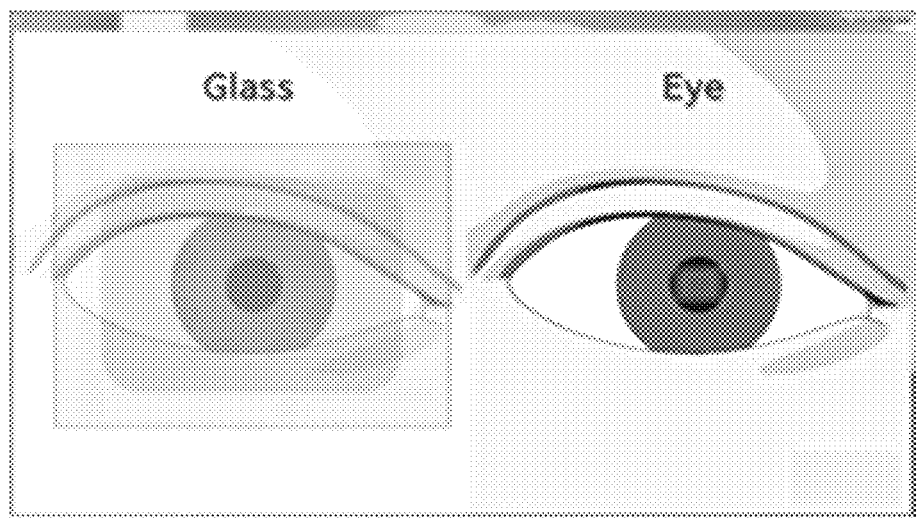

FIG. 38 is an image illustrating performing an operation corresponding to the command icon.

Referring to FIGS. 7 and 38, the operation corresponding to the command icon is performed based on the input command.

According to the present invention, the display element and the display driver circuit are separated and stacked, so that the display driver circuit may be variously designed regardless of the display element. Thus, an opening ratio of the display element is improved, and various circuits for improving image display quality may be added into the display driver circuit.

Also, the display driver circuit includes the second transistor for stably charging the first capacitor, the third transistor for compensating the output voltage of the driving transistor, and the fourth transistor to output a stable driving voltage.

In addition, the display driver circuit uses signals output from the current scan line and an adjacent scan line to securely charge the first capacitor and compensate the driving voltage output from the driving transistor, thereby outputting a stable driving voltage.

Also, the photo sensing element is disposed in a different layer physically separated from the display element to minimize an effect of a noise caused by a display output light generated by the display element.

Also, the upper structure includes the light guide, the light shield layer, the optical filter to block the light leaked from the display element, thereby improving sensing accuracy of the photo sensing element.

Also, the time for driving the display element and the photo sensing element are alternately arranged to remove a noise caused by the display element, thereby improving the sensing accuracy of the photo sensing element.

Also, the display elements are arranged in the hexagonal array shape to maximize the opening ratio, thereby improving an image display quality.

Also, the photo sensing elements are arranged in the hexagonal array shape to easily compensate an error caused a defected element using data of the adjacent element.

Also, the photo sensing element only senses the light having passed through the color filter to decrease noise caused by the display element and improve the sensing accuracy.

Also, the photo sensing readout circuit includes the reset transistor and the select transistor to decrease the noise caused by the display element, thereby improving the sensing accuracy.

Also, the photo sensing readout circuit senses an external luminance to control input of the electric signal to the driving transistor, thereby preventing deterioration of the driving transistor by a long time use.

Also, the second electrode disposed on the light emitting layer includes the lines of the star shape, etc., to improve the transmittance of the light generated from the light emitting layer.

Thus, a small size and a high resolution suitable for a micro display may be realized using the three-dimensional stacking process.

Also, a manufacturing cost of the upper structure is decreased, and various materials may be used for the display element, so that lifetime problem of a conventional display such as a conventional organic light emitting display (OLED) device, etc., may be solved. Furthermore, when light emitting diodes (LEDs) are used, more stable operation may be possible and a size of a unit cell may be decreased. Thus, high resolution may be realized on a micro display.

Also, the driving circuit part is physically separated from the display element, so that the driving circuit part may be manufactured using a conventional semiconductor process. Thus, stability of the driving circuit part is excellent, and deterioration of electric characteristics generated in conventional amorphous silicon (a-Si) or polysilicon may be solved.

Also, the lower structure and the upper structure are separately manufactured using three dimensional stacking process, so that the driving circuit part of the lower structure does not affect the area of the display element part of the upper structure, thereby maximizing the opening ratio. Furthermore, a conventional semiconductor process may be used for the driving circuit part to improve stability, so that the number and the arrangement of the transistors may be arbitrarily changed by the vertical arrangement disposed under the display elements. Thus, various compensating circuits may be added to the driving circuit.

Also, the driving circuit part and the sensing element of the lower plate may be formed through the conventional semiconductor process, and the display element of the upper plate may be formed through various processes such as using composite semiconductors, etc., so that the processes for the upper plate may be separated from the processes for the lower plate. Thus, a dual type element for simultaneously displaying and sensing with small cost may be realized using currently developed processes.

Also, driving timings of the display element and the photo sensing element are separated from a time axis to decrease an interference noise generated in the photo sensing element by the display element.

Also, one photo sensing element is disposed on a contact portion between three display elements to increase a space resolution of the display array and the photo sensing array based on arrangement characteristics of pixel cells. Also, when an error of the photo sensing element is generated, data compensation becomes easier using data of the peripheral element.

Thus, a color display device having photo sensing operation may be manufactured.

Also, the display device is controlled by iris recognition to be controlled without an additional interface outside of the display device. Thus, the size of the interface unit is decreased, and the size of the display device is decreased. Also, the display device may be controlled without a hand.

The present invention has an industrial applicability such as an electric device such as a smart glass integrally formed with a display function and a sensing function, a detecting device capable of detecting genetic material, pollution material, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
   an upper structure including a display element having:
      a first electrode;
      a light emitting layer disposed on the first electrode to generate light; and
      a second electrode disposed on the light emitting layer to transmit the light;
   a lower structure including a display driving circuit, the display driving circuit receiving an image signal to apply an electric power to the first electrode, the lower structure physically separated from the upper structure to be spaced apart from the upper structure by a predetermined distance with respect to a vertical direction; and
   a connecting element disposed between the upper structure and the lower structure to connect the first electrode to the display driving circuit,
   wherein the display element of the upper structure is spaced apart from an adjacent display element so that an external light is incident into a space between the adjacent display elements, and the lower structure further comprises:
   a photo sensing element disposed between the display elements to change the external light into an electric signal; and
   a photo sensing readout circuit generating a photo sensing signal using the electric signal received from the photo sensing element.

2. The display device of claim 1, wherein the display driving circuit comprising:
   a driving transistor applying an electric signal to the display element;
   a capacitor storing a voltage applied to the driving transistor; and
   a select transistor selecting a driving display element.

3. The display device of claim 1, wherein the photo sensing readout circuit comprises:
   a transfer transistor transmitting the electric signal generated by the photo sensing element;
   a reset transistor initializing the photo sensing readout circuit;
   a driving transistor driving a signal line by the electric signal readout by the photo sensing readout circuit; and
   a select transistor controlling connection between the driving transistor and the signal line.

4. The display device claim 1, wherein the display driving circuit, the photo sensing element, and the photo sensing readout circuit are disposed on the same substrate.

5. The display device of claim 1, wherein the light emitting layer generates a bluish light or a ultraviolet light, and
   the display element further comprises:
   a photo change layer disposed on the second electrode to change the light generated from the light emitting layer into a visible light; and
   a color filter disposed on the photo change layer to change the visible light into a primary color light.

6. The display device of claim 1, wherein the light emitting layer generates a bluish light or a ultraviolet light, and the display element further comprises a photo change layer disposed on the second electrode to change the light generated from the light emitting layer into a primary color light.

7. A display device comprising:

an upper structure including a display element having:
  a light emitting layer generating light; and
  a first electrode disposed under the light emitting layer to be coupled with a positive electrode and a negative electrode of the light emitting layer, the first electrode not blocking a path of the light generated from the light emitting layer;
a lower structure including a display driving circuit, the display driving circuit receiving an image signal to apply an electric power to the positive electrode and the negative electrode of the light emitting layer through the first electrode, the lower structure physically separated from the upper structure to be spaced apart from the upper structure by a predetermined distance with respect to a vertical direction; and
a connecting element disposed between the upper structure and the lower structure to connect the first electrode to the display driving circuit,
wherein the display element of the upper structure is spaced apart from an adjacent display element so that an external light is incident into a space between the adjacent display elements, and the lower structure further comprises:
a photo sensing element disposed between the display elements to change the external light into an electric signal; and
a photo sensing readout circuit generating a photo sensing signal using the electric signal received from the photo sensing element.

8. The display device claim 7, wherein the photo sensing readout circuit comprises:

a transfer transistor transmitting the electric signal generated by the photo sensing element;
a reset transistor initializing the photo sensing readout circuit;
a driving transistor driving a signal line by the electric signal readout by the photo sensing readout circuit; and
a select transistor controlling connection between the driving transistor and the signal line.

9. A method of manufacturing a display device, comprising:

forming a display driving circuit, a photo sensing element, and a photo sensing readout circuit on the same surface of a base substrate, the photo sensing element changing an external light into an electric signal, the photo sensing readout circuit changing the electric signal into a photo sensing signal;
forming a connecting element on the display driving circuit;
sequentially forming a light emitting layer and a first electrode on an additional substrate, the first electrode being connected to the light emitting layer;
aligning the additional substrate on which the light emitting layer and the first electrode are formed over the base substrate on which the display driving circuit, the photo sensing element, and the photo sensing readout circuit are formed;
combining the first electrode with the connecting element;
removing the additional substrate from the light emitting layer; and
forming a second electrode on the light emitting layer, the second electrode transmitting a light generated from the light emitting layer.

10. The method of claim 9, further comprising:

forming a photo change layer on the second electrode, the photo change layer transforming the light generated from the light emitting layer; and
forming a color filter filtering a light generated from the photo change layer into a primary color light.

11. A method of manufacturing a display device, comprising:

forming a display driving circuit, a photo sensing element, and a photo sensing readout circuit on the same surface of a base substrate, the photo sensing element changing an external light into an electric signal, the photo sensing readout circuit changing the electric signal into a photo sensing signal;
forming a connecting element on the display driving circuit;
sequentially forming a light emitting layer on an additional substrate and first and second electrodes on a first substrate of the light emitting layer, the first and second electrodes being connected to the light emitting layer;
aligning the additional substrate on which the light emitting layer and the first and second electrodes are formed over the base substrate on which the display driving circuit, the photo sensing element, and the photo sensing readout circuit are formed;
combining the first electrode with the connecting element; and
removing the additional substrate from the light emitting layer.

12. A method of head mount display (HMD) interfacing using a display device, the display device comprising an upper structure, a lower structure, and a connecting element, the upper structure including a display element having a first electrode, a light emitting layer disposed on the first electrode to generate light, and a second electrode disposed on the light emitting layer to transmit the light, the display element of the upper structure being spaced apart from an adjacent display element so that an external light is incident into a space between the adjacent display elements, the lower structure including a display driving circuit, a photo sensing element, and a photo sensing readout circuit generating a photo sensing signal using the electric signal received from the photo sensing element, the display driving circuit receiving an image signal to apply an electric power to the second electrode, the display driving circuit being overlapped with the first electrode of the upper structure to be disposed under the upper structure, the photo sensing element disposed between the display elements to change the external light into an electric signal, the lower structure being physically separated from the upper structure by a predetermined distance with respect to a vertical direction, the connecting element disposed between the upper structure and the lower structure to connect the first electrode to the display driving circuit, the method comprising:

releasing a lock mode using the photo sensing element and the photo sensing readout circuit;
sensing an operation of continuously blinking two or more times or closing one eye to display a cursor or a command icon on the display element;
sensing iris movement so that the iris movement is coupled with the cursor;
transporting the cursor to the command icon;

selecting the command icon through blinking one or more times; and performing a command corresponding to the command icon.

* * * * *